United States Patent
Fong et al.

(10) Patent No.: US 7,170,956 B1
(45) Date of Patent: Jan. 30, 2007

(54) FREQUENCY AGILE TUNER AND VARIABLE RATE DECIMATOR FOR DIGITAL DEMODULATOR

(75) Inventors: Mark Fong, San Jose, CA (US); David Bruce Isaksen, Mountain View, CA (US)

(73) Assignee: Wideband Semiconductors, Inc, Mountain View, CA (US)

( * ) Notice: Subject to any disclaimer, the term of this patent is extended or adjusted under 35 U.S.C. 154(b) by 792 days.

(21) Appl. No.: 10/345,863

(22) Filed: Jan. 15, 2003

(51) Int. Cl.
*H04L 27/06* (2006.01)
*H04B 27/06* (2006.01)
*H04B 1/18* (2006.01)

(52) U.S. Cl. .................... 375/344; 375/350; 455/192.2

(58) Field of Classification Search ............... 375/360, 375/324, 326, 327, 328, 261, 266, 344, 140, 375/142, 143, 145, 149, 150, 340, 346, 350, 375/355, 152, 316; 329/304, 305, 306–307; 348/641, 726, 727; 455/258, 192.2, 182.2
See application file for complete search history.

(56) References Cited

U.S. PATENT DOCUMENTS 5,375,146 A * 12/1994 Chalmers .................... 375/350
5,425,057 A * 6/1995 Paff ........................... 375/326
5,487,186 A * 1/1996 Scarpa ..................... 455/192.2
5,495,203 A * 2/1996 Harp et al. ................. 329/306
5,612,975 A * 3/1997 Becker et al. .............. 375/319
6,141,387 A   10/2000 Zhang
6,282,248 B1* 8/2001 Farrow et al. .............. 375/324
2002/0122511 A1* 9/2002 Kwentus et al. ............ 375/343
2002/0156820 A1* 10/2002 Kishi ......................... 708/300

* cited by examiner

*Primary Examiner*—Mohammed Ghayour
*Assistant Examiner*—Sophia Vlahos
(74) *Attorney, Agent, or Firm*—Boris G. Tankhilevich

(57) ABSTRACT

An apparatus for demodulating a digital input signal having a pre-assigned symbol rate by using a single sample clock signal is disclosed. The pre-assigned symbol rate is selected from the group consisting of a plurality of symbol rates. The apparatus comprises: a Cascaded Integrated Comb (CIC) Decimator filter configured to perform a filtering-decimation operation to isolate the down converted digital signal having the pre-assigned symbol rate; a Shaper configured to restore an original spectrum of the I and Q components of the CIC output signal; and a CIC tuner loop filter configured to insert the estimated by the Coarse Frequency estimation block frequency offset into a carrier loop in order to complete a carrier recovery of the pre-assigned input digital signal.

28 Claims, 13 Drawing Sheets

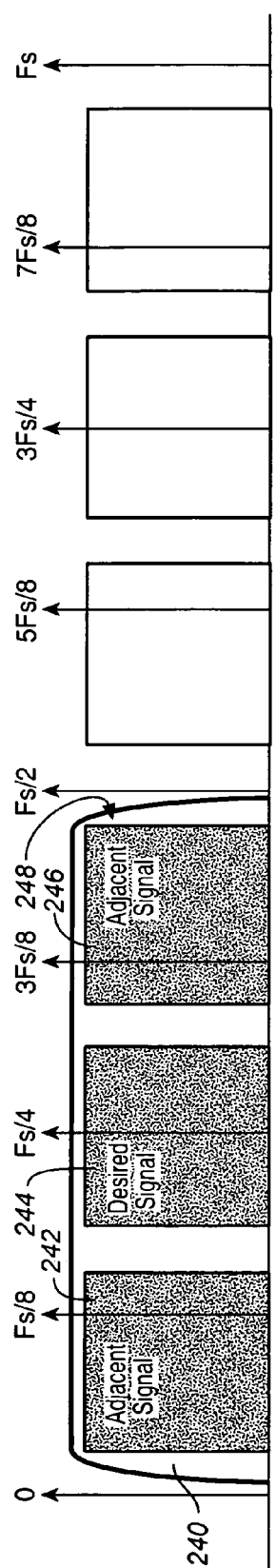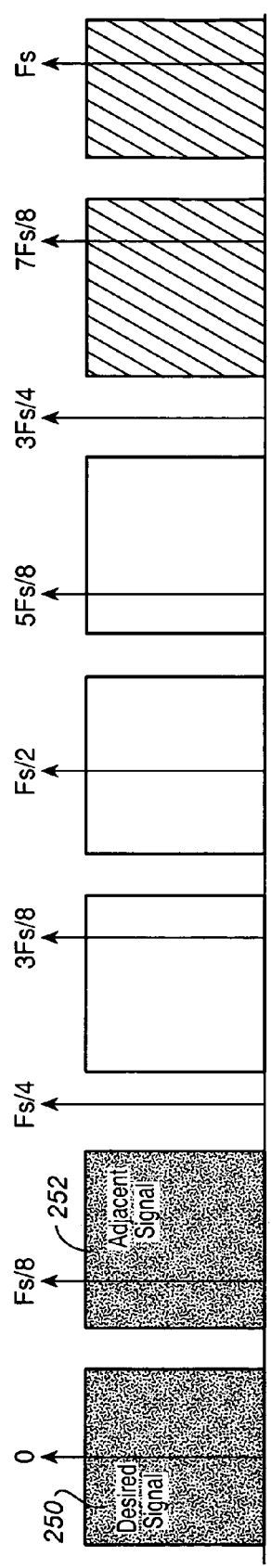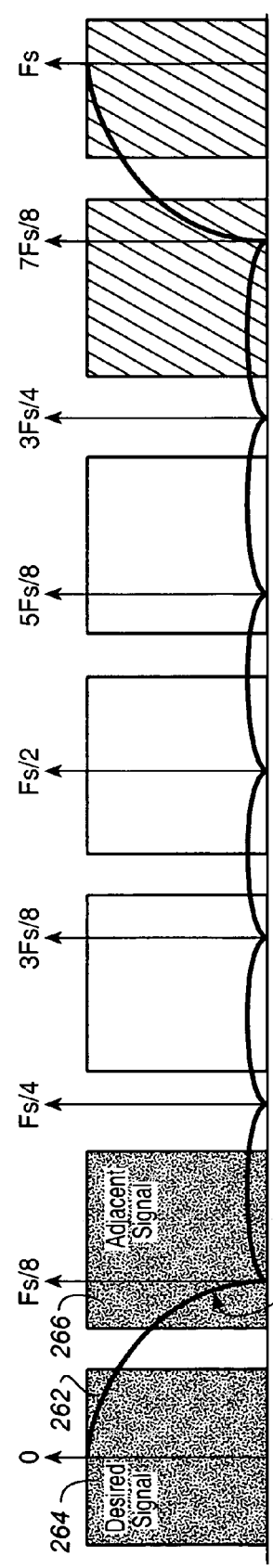

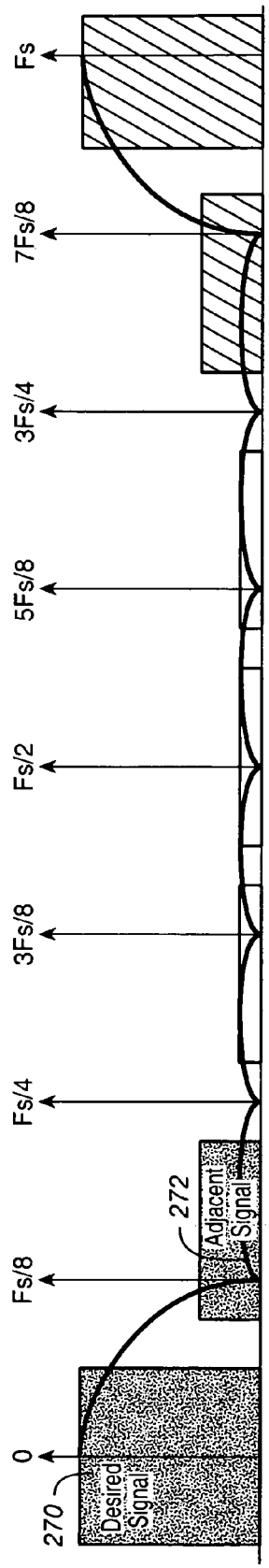
FIG. 8B1
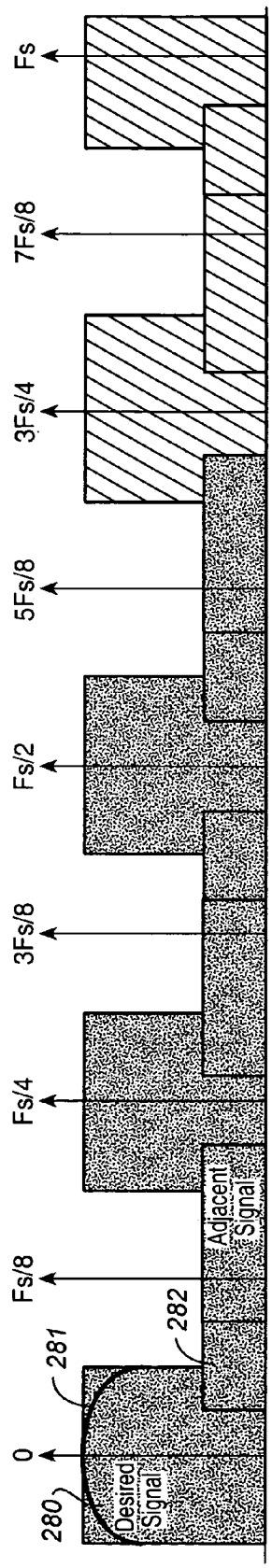
FIG. 8B2
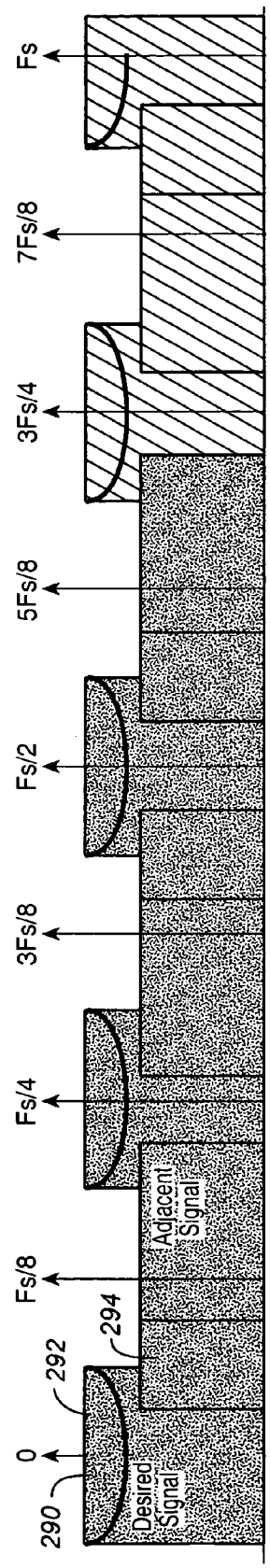
FIG. 8B3

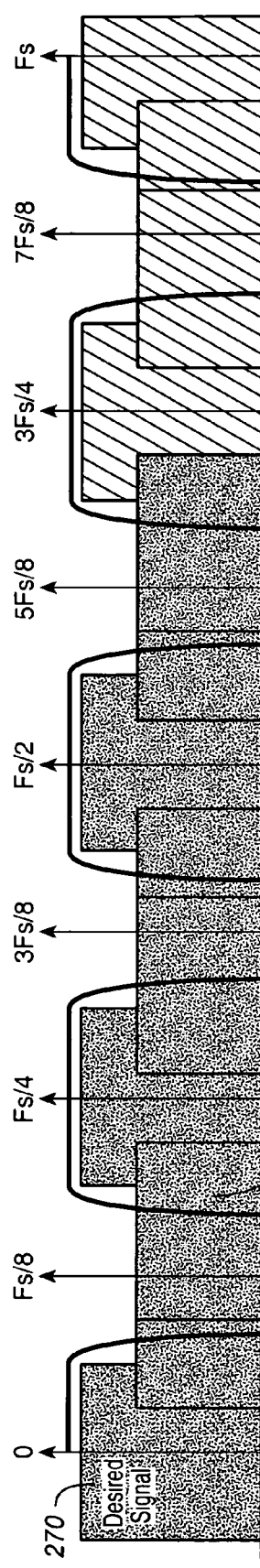
FIG. 8C1
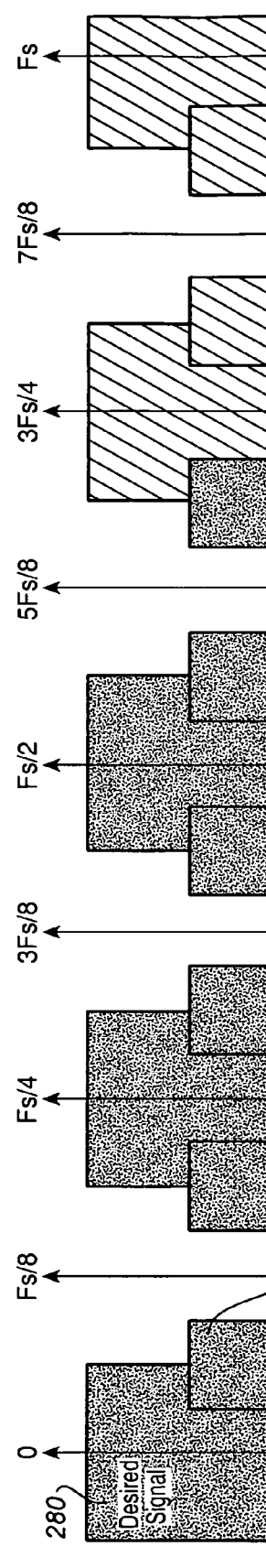
FIG. 8C2

FIR representation of the I Component of the shaper filter

Typical amplitude response of an FIR approximation to an ideal lowpass filter

FREQUENCY AGILE TUNER AND VARIABLE RATE DECIMATOR FOR DIGITAL DEMODULATOR

BACKGROUND OF THE INVENTION

1. Field of the Invention

The present invention relates to the filed of the digital signal processing, and more specifically, to the field of digital demodulators.

2. Discussion of the Prior Art

When a plurality of symbol rates are used by transceivers of digital signals, each transceiver should be capable of multi-rate operations with different symbols rates. However, if each digital modem utilizes different sample clock signals, the modem architecture involves complicated analog components, and the speed and quality of signal demodulation is not optimized.

What is needed is to design a digital modem that allows multi-rate operations with different symbol rates, but that utilizes a single sample clock signal, thus reducing the complexity of analog components and increasing the speed of signal acquisition.

SUMMARY OF THE INVENTION

To address the shortcomings of the available art, the present invention provides for a digital modem that allows multi-rate operations with different symbol rates, but that utilizes a single sample clock signal.

One aspect of the present invention is directed to an apparatus for demodulating a digital input signal having a pre-assigned symbol rate by using a single fixed rate sample clock signal. The pre-assigned symbol rate is selected from the group consisting of a plurality of symbol rates.

In one embodiment of the present invention; the apparatus comprises: a Complex Mixer, a Cascaded Integrated Comb (CIC) Decimator filter, a Shaper filter, a CIC cutoff filter, a Demodulator, a Coarse Frequency estimation block, and a CIC tuner loop filter.

In one embodiment of the present invention, the Complex Mixer is configured to down convert the input digital signal having the pre-assigned symbol rate signal from a carrier frequency to a baseband frequency.

In one embodiment of the present invention, the Cascaded Integrated Comb (CIC) Decimator filter is configured to perform a filtering-decimation operation to isolate the down converted digital signal having the pre-assigned symbol rate, and configured to output an Inphase (I) component and a Quadrature (Q) component of a CIC_output_signal having a CIC-shaped decimated spectrum.

In one embodiment of the present invention, the CIC Decimator further includes an integer K-stage integrator and an integer K of CIC mixers. The integer K-stage integrator further includes an integer K of parallel CIC integrators, and an integer K of Numerical Control Oscillators (NCO)s. The K-stage integrator is configured to increase by a K-factor a processing speed of the incoming digital input signal having the pre-assigned data rate.

In one embodiment of the present invention, the CIC Decimator further includes at least one Comb filter further including an integer M-section cascaded comb filter and a decimation block. Each section of the M-section cascaded comb filter further includes an integer N of registers, and a substracter. Each section of the M-section cascaded comb filter having the integer N of registers differentiates the integrated output of the K-stage integrator with a combinatorial delay of N samples. The decimation block decimates an output signal of the M-section cascaded comb filter by a decimation factor R. The CIC Decimator requires $\log_2[(RN)]^M$ additional bits as compared with a number of bits in the input digital data signal to avoid overflow. R is an integer.

In one embodiment, the apparatus of the present invention further includes a plurality of pipeline registers. In one embodiment of the present invention, each pipeline register is located between at least two consecutive sections of the M-section cascaded comb filter. Each pipeline register is configured to perform a pipeline computation on a plurality of input symbols in order to increase the speed of operation of each section of the M-section cascaded comb filter by N-factor by minimizing the combinatorial delay of N samples. A pipeline delay of the CIC Decimator having the plurality of pipeline registers is determined by one section of the M-section cascaded comb filter, wherein each section of the M-section cascaded comb filter includes the integer N registers.

In one embodiment of the present invention, the CIC Decimator further includes a programmable CIC Decimator having a CIC_Decimator_programmable frequency response function.

In one embodiment of the present invention, the Shaper filter is configured to restore an original spectrum of the I and Q components of the CIC_output_signal having the CIC-shaped decimated spectrum, and is configured to output I and Q components of a shaper_filter_output_signal. The I component of the shaper_filter_output_signal, as well as the Q component of the shaper_filter_output_signal, include a shaper_signal component having the restored original spectrum of the pre-assigned signal and include an adjacent shaper-signal component having a spectrum that is adjacent to the restored original spectrum of the pre-assigned signal. In one embodiment of the present invention, the Shaper filter further includes a Finite Impulse Response (FIR) filter including an integer L of taps and including an integer L of filter coefficients; wherein the FIR filter includes a frequency response function depending on the integer L. In one embodiment of the present invention, the Shaper_filter_programmable frequency response function is equal to an inverse function of the CIC_Decimator_programmable frequency response function within a Bandwidth (BW) of the pre-assigned input digital signal.

In one embodiment of the present invention, the CIC cutoff filter is configured to pass the shaper_signal component having the restored original spectrum of the pre-assigned signal, and is configured to pass a part of the adjacent signal having a spectrum part that is carved out by a frequency response function of the CIC cutoff filter.

In one embodiment of the present invention, the Demodulator is configured to demodulate and to extract a frequency component from the shaper_signal component having the restored original spectrum of the pre-assigned signal.

In one embodiment of the present invention, the Coarse Frequency estimation block is configured to estimate a frequency offset between the pre-assigned carrier frequency and the frequency component of the shaper_signal component having the restored original spectrum of the pre-assigned signal.

In one embodiment of the present invention, the CIC tuner loop filter is configured to insert the estimated by the Coarse Frequency estimation block frequency offset into a carrier loop in order to complete a carrier recovery of the pre-assigned input digital signal. In one embodiment of the present invention, the CIC tuner loop filter further includes an adaptive CIC tuner loop configured to perform an adaptive carrier loop frequency adjustment to compensate for a change in an external parameter selected from the group consisting of: {temperature; humidity; and at least one circuit elements aging parameter}.

In one embodiment of the present invention, the adaptive CIC tuner loop further includes: a controller configured to generate a control update signal; a nominal frequency update block configured to update a nominal frequency coefficient in the adaptive CIC tuner loop; a coarse frequency offset update configured to update a coarse frequency offset coefficient in the adaptive CIC tuner loop, a phase update block electrically configured to update a phase coefficient in the adaptive CIC tuner loop, a frequency accumulator, and a phase accumulator.

In one embodiment of the present invention, the controller further includes: an algorithm comprising at least the following steps: (A) if a frequency update in the frequency accumulator exceeds a predetermined high frequency threshold; use a plurality of negative frequency coefficients for a next loop frequency update; (B) if the frequency update in the frequency accumulator is lower than a predetermined low frequency threshold; use a plurality of positive frequency coefficients for the next loop frequency update; (c) if a phase update in the phase accumulator exceeds a predetermined high phase threshold; use a plurality of negative phase coefficients for a next loop phase update; and (D) if the phase update in the phase accumulator is lower than a predetermined low phase threshold; use a plurality of positive phase coefficients for the next phase loop update.

Another aspect of the present invention is directed to a method for demodulating a digital input signal having a pre-assigned symbol rate by using a single sample clock signal. The pre-assigned symbol rate is selected from the group consisting of a plurality of symbol rates.

In one embodiment of the present invention, the method comprises the following steps: (A) down converting the input digital signal having the pre-assigned symbol rate from a carrier frequency to a baseband frequency by using a Complex Mixer; (B) performing a filtering-decimation operation by using a Cascaded Integrated Comb (CIC) Decimator filter in order to isolate the down converted digital signal having the pre-assigned symbol rate; (C) generating a CIC_output_signal having a CIC-shaped decimated spectrum by using the (CIC) Decimator filter; (D) restoring an original spectrum of the CIC_output_signal having the CIC-shaped decimated spectrum by using a Shaper filter, wherein an I component and Q component of a shaper_filter_output_signal include a shaper_signal component having the restored original spectrum of the pre-assigned signal and include an adjacent shaper-signal component having a spectrum that is adjacent to the restored original spectrum of the pre-assigned signal; (E) using a CIC cutoff filter to pass the shaper_signal component having the restored original spectrum of the pre-assigned signal and to pass a part of the adjacent signal having a spectrum part that is carved out by a frequency response function of the CIC cutoff filter; F) demodulating and extracting a frequency component from the shaper_signal component having the restored original spectrum of the pre-assigned signal by using a Demodulator; (G) estimating a frequency offset between the pre-assigned carrier frequency and the frequency component of the shaper_signal component having the restored original spectrum of the pre-assigned signal by using a Coarse Frequency estimation block; and (H) completing a carrier recovery of the pre-assigned input digital signal by inserting the estimated by the Coarse Frequency estimation block frequency offset into a carrier loop by using a CIC tuner loop filter.

In one embodiment, the method of the present invention further includes the step of selecting a passband mode or a baseband mode of operation. In the baseband mode of operation, the Complex Mixer is clocked by a clock signal equal to an A/D sampling rate, and outputs Inphase and Quadrature outputs for each clock signal. In the passband mode of operation, the Complex Mixer is clocked by a clock signal equal to one half of said A/D sampling rate, however, 2 A/D samples are accepted and processed for each clock, and 2 Inphase and 2 Quadrature outputs are produced for each clock at ½ the A/D sample rate.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

FIG. 8A1 illustrates the sampled spectrum of the input signal.

FIG. 8A2 shows the spectrum of the signal being processed by the apparatus of the present invention of FIG. 1 after the complex down conversion is performed by the Complex Mixer.

FIG. 8A3 depicts the CIC Decimate_by_2 Filter frequency response.

FIG. 8B1 illustrates the spectrum of the signal being processed by the apparatus of the present invention of FIG. 1 after the CIC Filtering and prior to the Decimate_by_4 operation.

FIG. 8B2 shows the spectrum of the signal being processed by the apparatus of the present invention of FIG. 1 after the CIC Filtering and the Decimate_by_4 operation.

FIG. 8B3 depicts the spectrum of the signal being processed by the Shaping Filter of the apparatus of the present invention of FIG. 1.

FIG. 8C1 illustrates the cutoff Filter frequency response.

FIG. 8C2 depicts the spectrum of the signal being processed by the Cutoff Filter of the apparatus of the present invention of FIG. 1.

DETAILED DESCRIPTION OF THE PREFERRED AND ALTERNATIVE EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
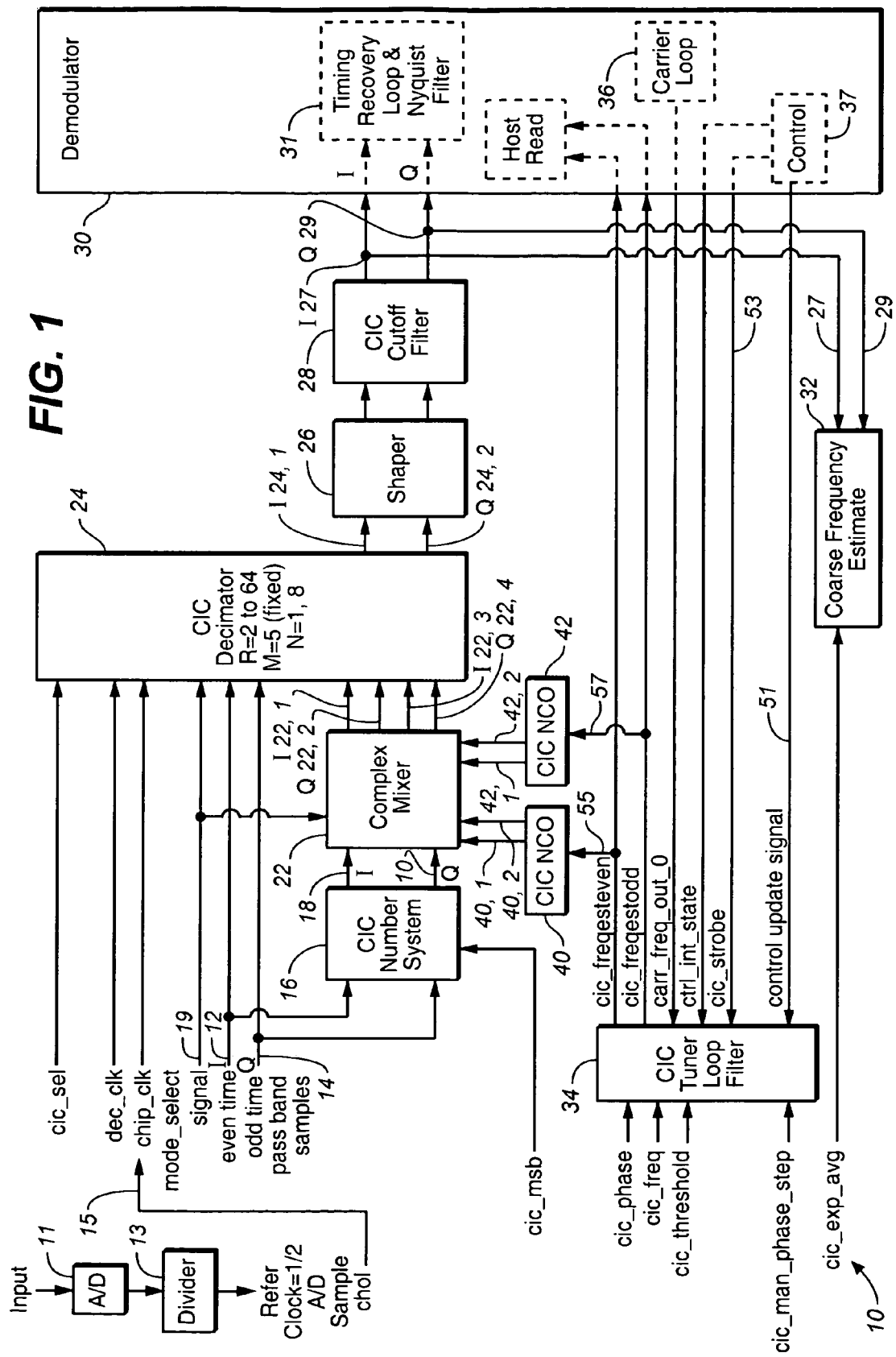
FIG. 1 depicts the apparatus of the present invention for demodulating a digital input signal having a pre-assigned symbol rate by using a single sample clock signal, wherein the pre-assigned symbol rate is selected from the group consisting of a plurality of symbol rates.

FIG. 1 depicts the apparatus 10 of the present invention in a passband mode for demodulating a passband digital input signal having even 12 and odd time 14 inputs (2 samples per clock) by using a single sample clock signal 15. In the passband mode, the clock signal 15 is equal to ½ of the analog-to-digital (A/D) converter 11 sample clock rate, whereas divider 13 divides the A/D sample clock by 2. The passband or baseband mode of operation can be selected by using a mode_select signal 19.

In the prior art implementation of an apparatus (not shown) for demodulating a digital input signal having a variable symbol rate, one has to use a synthesizer (not shown) to generate a proper clock signal for each input signal depending on the symbol rate to achieve the preferred (sample per symbol) ratio which is between (4–8) (samples per symbol) for a passband mode or 2–4 samples per symbol for a baseband mode. The apparatus 10 of the present invention is a simpler circuit than a prior art circuit because it utilizes a single clock for demodulating a digital input signal having a variable symbol rate without using a synthesizer which is an expensive device that is difficult to build.

In one embodiment of the present invention, for QAM demodulators output, as shown in FIG. 1, the output signals 27 and 29 are processed by the Nyquist Filter and Timing Recovery Circuit block 31, and thereafter are inserted into the carrier loop. (See discussion below). The Nyquist Filter and Timing Recovery Circuit block 31 is disclosed in the U.S. Pat. No. 6,278,741, entitled "TIMING RECOVERY CIRCUIT IN QAM MODEMS", and assigned to the assignee of the present patent application. The patent '741 is incorporated in its entirety in the present patent application. More specifically, the patent '741 discloses a method for generating a correction command for advancing or delaying the sample timing of a modem front end used to recover data from an incoming QAM baseband signal having maximum/minimum. The decision making circuit of patent '741 (not shown) is configured to utilize the averaged local error signal in order to make a global decision regarding the sampling point position relative to the baseband signal maximum/minimum. The exponential averaging logic of the patent '741 preferably operates at twice the symbol rate in the perfect sampling timing case, as well in the worst case scenario wherein the sampling timing is maximum out of phase.

Referring still to FIG. 1, in one embodiment of the present invention, the apparatus 10 includes a Cascaded Integrated Comb (CIC) Number system block 16 configured to select the number representation of the input digital signal that is most suitable for the purposes of the present invention. In one embodiment, the number representation of the input digital, signal is selected by the CIC Number system block 16 to be an offset binary number that compliments each most significant bit (MSB) for any type of Inphase (I) 12 and Quadrature (Q) 14 components of the input digital signal and outputs the Inphase (I) 18 and Quadrature (Q) 20 components of the input digital signal as offset binary numbers.

Referring still to FIG. 1, in one embodiment, the apparatus of the present invention 10 in the passband mode further includes a Complex Mixer 22 configured to down convert from a carrier frequency to a baseband frequency the even time samples I components 18 and odd time samples Q components 20 of the input digital signal having the pre-assigned symbol rate signal and represented as offset binary numbers.

Figure 2:
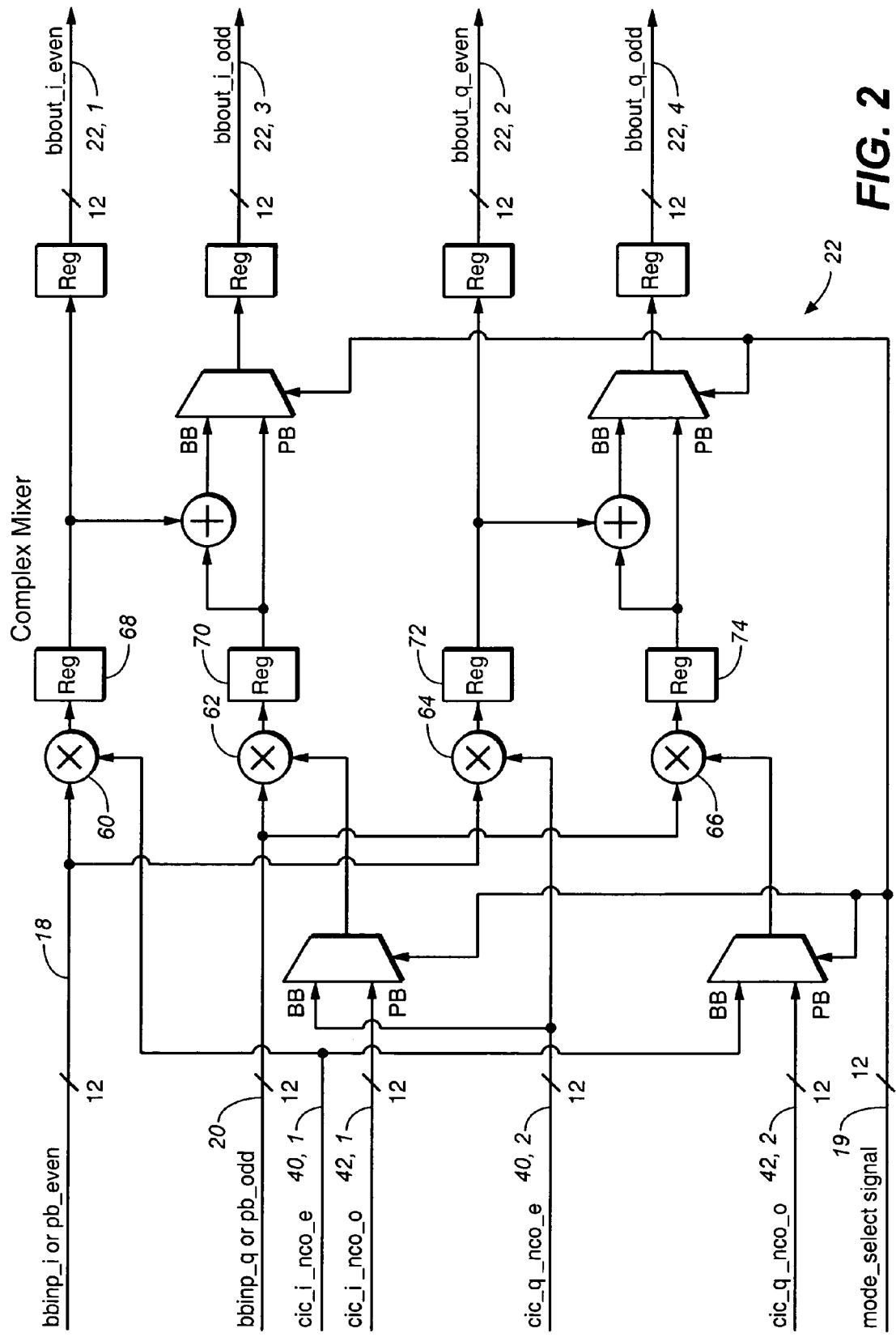
FIG. 2 depicts Complex Mixer employed by the apparatus of the present invention of FIG. 1 in more details.

In one embodiment, FIG. 2 depicts the Complex Mixer 22 employed by the apparatus of the present invention 10 (of FIG. 1) in more details. In the passband mode, the Complex Mixer 22 accepts the even time sample 18 and the odd time sample 20 and produces I even output (22,1), I odd output (22,3), Q even output (22,2), and Q odd output (22,4) per clock.

Figure 3:
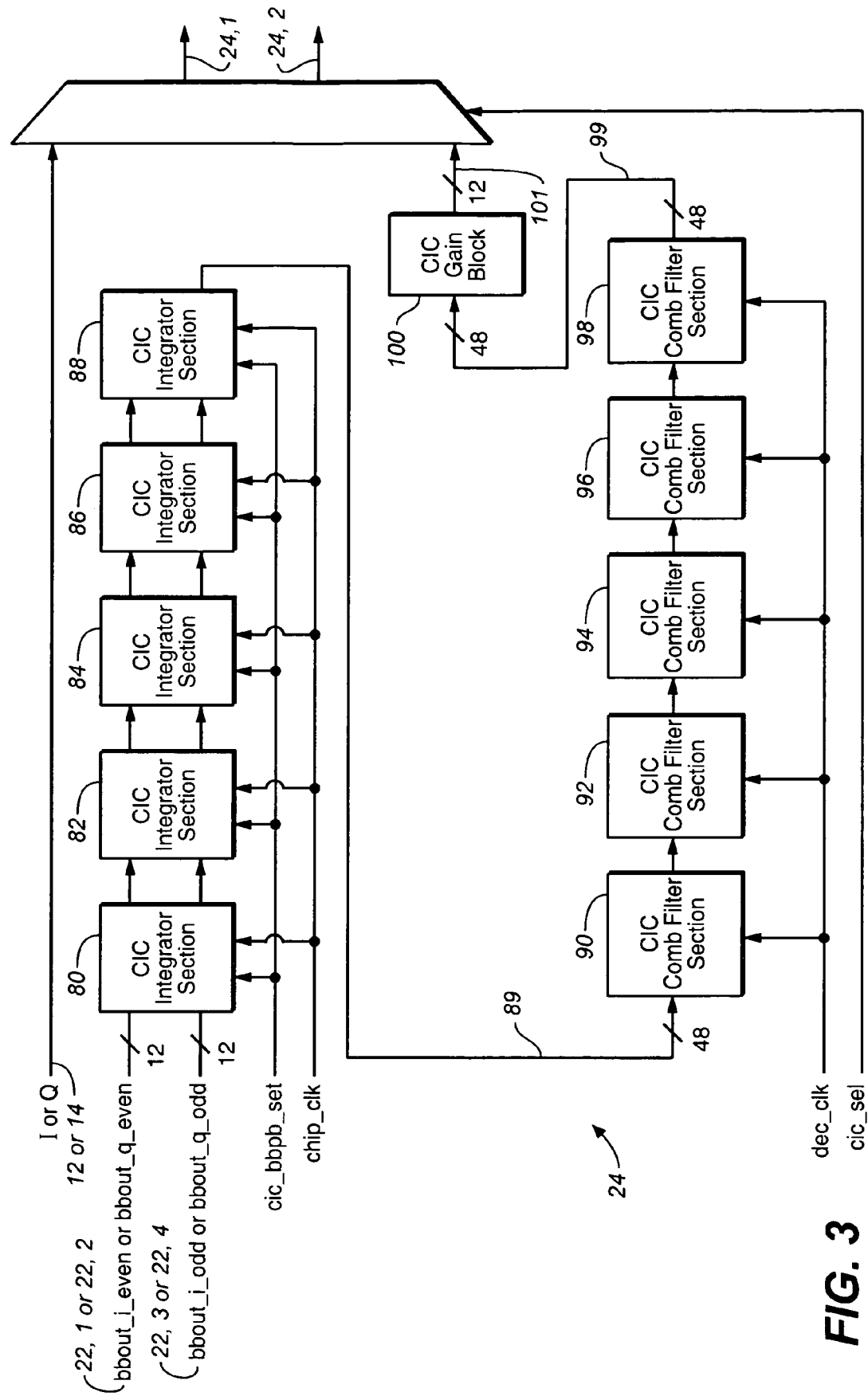
FIG. 3 illustrates the Cascaded Integrated Comb (CIC) Decimator filter of the present invention of FIG. 1 in more details.

In one embodiment of the present invention in the passband mode, FIG. 3 illustrates the Cascaded Integrated Comb (CIC) Decimator filter 24 employed in the apparatus 10 (of FIG. 1) in more details. The CIC Decimator 24 is configured to perform a filtering-decimation operation to isolate the down converted digital signal having the pre-assigned symbol rate and including I even (22,1), I odd (22,3), Q even (22,2), and Q odd (22,4) outputs from the Complex Mixer 22. The CIC Decimator 24 is configured to output an Inphase (I) component 24,1 and a Quadrature (Q) component 24,2 of a CIC_output_signal having the CIC-shaped decimated spectrum.

In one embodiment of the present invention, the CIC Decimator 24 of FIG. 3 further includes a plurality of CIC integrators (80,82, 84, 86, 88) and a plurality of Comb filters (90, 92, 94, 96, 98).

Figure 4A:
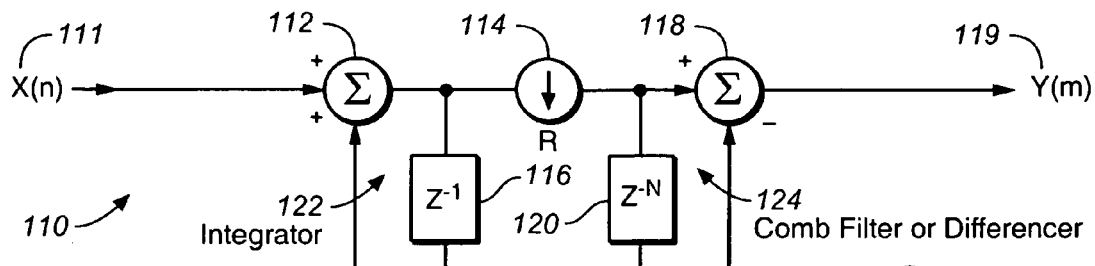
FIG. 4A shows a block diagram of the conventional implementation of the CIC Decimator.

FIG. 4A includes a block diagram of the conventional implementation of the CIC Decimator 110. Conventional Cascaded Integrated Comb (CIC) filters have the same transfer function as boxcar filters. However, there is much more latitude in the decimation ratios without substantial increase in circuitry that can be used, and the filters can also be cascaded. The conventional boxcar filter (not shown) is a CIC filter without decimation. The block diagram of the conventional implementation of the CIC Decimator 110 (of FIG. 4A) includes sections of the boxcar filter 12 and 124, and decimation by R block 1–14. R is an integer. Since the block delay $z^{-N}$ 120 operates at a sample rate reduced by the factor R, it represents a delay of RN input samples. Therefore, the transfer function of the CIC Decimator 110 is as follows:

$$H(z) = \frac{(1 - z^{-RN})}{(1 - Z^{-1})} \qquad (1)$$

The frequency response of the CIC Decimator 110 is given by Eq. (2):

$$|H(f)| = \frac{|\mathrm{Sin}(\pi NRf/f_s)|}{|\mathrm{Sin}(\pi f/f_s)|} \qquad (2)$$

Figure 4B:
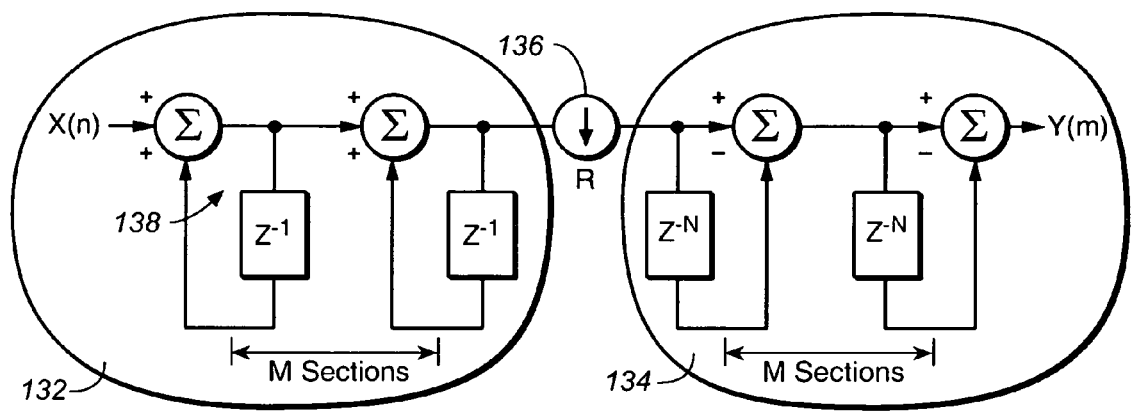
FIG. 4B depicts the conventional CIC decimator with M-cascaded sections.

The conventional CIC Decimator (110 of FIG. 4A) can be cascaded to improve the response function |H (f)| given by Eq. (2). FIG. 4B illustrates the conventional CIC decimator with M-cascaded sections. The frequency response for this configuration is given by Eq. (3):

$$\frac{|H(f)|}{|H(0)|} = \frac{|\mathrm{Sin}(\pi NRf/f_s)|^M}{|NR\mathrm{Sin}(\pi f/f_s)|} \qquad (3)$$

The conventional CIC decimator filter with M-cascaded sections 130 of FIG. 4B is a very flexible filter, and its response function is almost independent of the decimation ratio R when plotted in terms of the output (lower) sample rate. If we let the output sample rate be:

$$f_0 = f_s/R; \qquad (4)$$

the transfer function of Eq. (3) becomes:

$$\frac{|H(f)|}{|H(0)|} = \frac{|\mathrm{Sin}(\pi NRf/f_0)|^M}{|NR\mathrm{Sin}(\pi f/Rf_0)|} \qquad (5)$$

Figure 4C:
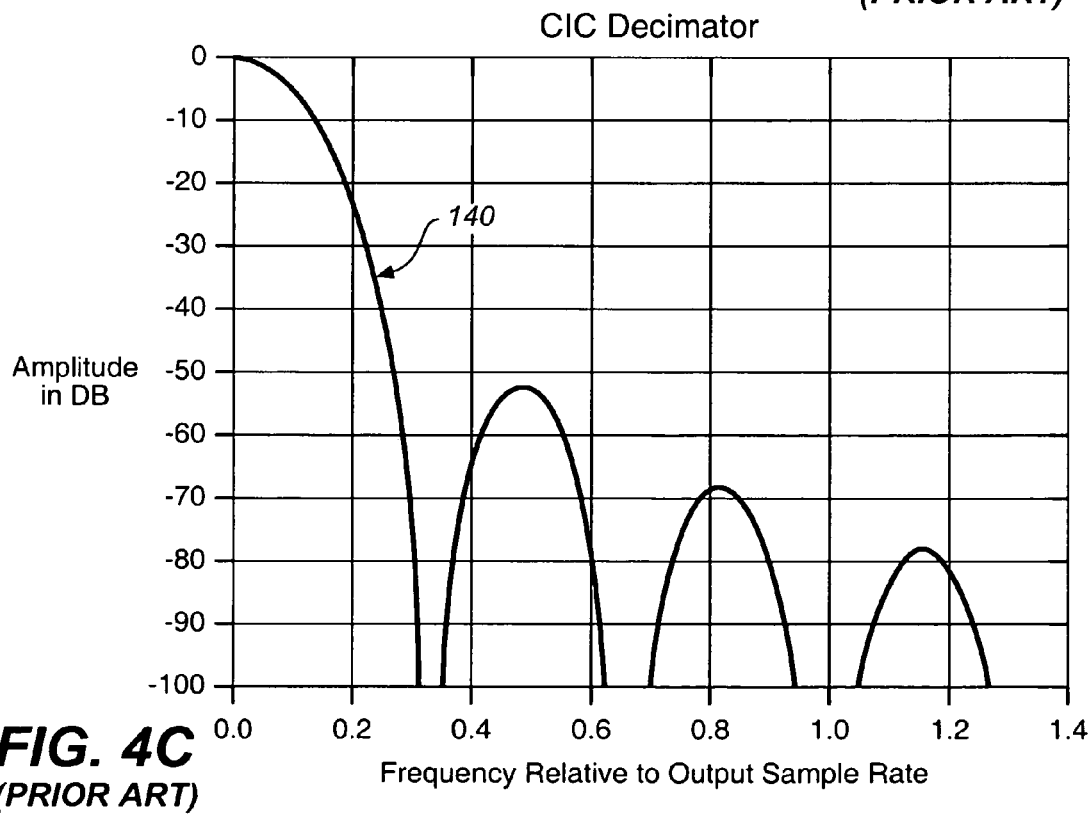
FIG. 4C illustrates the transfer function of Eq. (5) corresponding to the conventional CIC M-cascaded decimator of FIG. 4B.

The transfer function 140 of Eq. (5) is plotted in FIG. 4C for N=3, R=4, and M=4. The maximum response of the second lobe is (−) 52 dB, and the maximum response of the third lobe is (−) 69 dB. Thus, the conventional CIC M-cascaded Decimator can be used for various application and the protection against aliasing is considerable. The passband (3 dB) for the conventional CIC M-cascaded Decimator 130 of FIG. 4B is at 0.075 of the output sample frequency, and the 1 dB response is at 0.045. Because the transfer function of the CIC M-cascaded Decimator has a nominal passband gain of $(RN)^M$ according to Eq. (5), real overflow can be prevented by using registers that are larger than the input by a factor of $(RN)^M$.

Figure 5A:
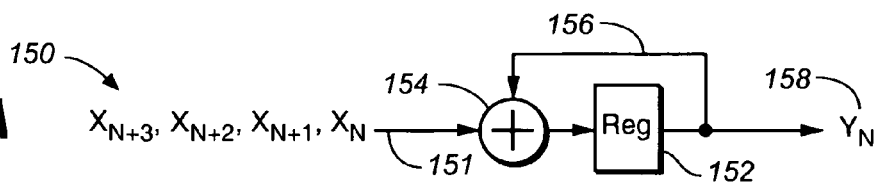
FIG. 5A depicts a single section of the conventional CIC Decimator integrator circuit that is configured to process a single input signal at a time.
Figure 5B:
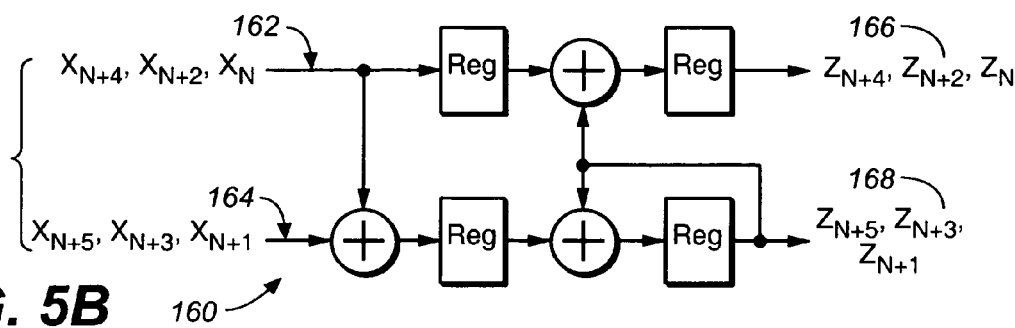
FIG. 5B illustrates the CIC Decimator integrator circuit of the present invention that is configured to process two symbols of the input signal for each internal clock signal.

FIG. 5A depicts a single section of the conventional CIC Decimator integrator circuit using the register 152, adder 154, and feedback loop 156 that is configured to process a single input signal 151 at a time. On the other hand, FIG. 5B illustrates the CIC Decimator integrator circuit 160 of the present invention that is configured to process two input signals 162 and 164 at a time, that enables processing of two symbols of the input signal for each internal clock signal. So, the apparatus 10 (of FIG. 1) of the present invention utilizing the CIC Decimator 24 that employs the integrator circuit 160 of FIG. 5B is configured to operate only at half of clock rate as opposed to the conventional circuitry CIC Decimator design. More specifically, the outputs $y_N$ 158 of the conventional circuitry 150 (of FIG. 5A) are derived over time as follows:

$y_N = x_N$ (Output at time N)

$y_N = x_{N+1} + x_N$ (Output at time N+1)

$y_{N+2} + x_{N+1} + x_N$ (Output at time N+2)

$y_{N+3} + x_{N+2} + x_{N+1} + x_N$ (Output at time N+3) \qquad (6)

On the other hand, the outputs 166 (168) of the circuitry of the present invention 160 (of FIG. 5B) are derived over time as follows:

$z_N = 0$ (Output at time N)

$z_{N+1} = 0$ (Output at time N+1)

$z_{N+2} = x_N$ (Output at time N)

$z_{N+3} = x_{N+1} + x_N$ (Output at time N+1)

$z_{N+4} = x_{N+2} + x_{N+1} + x_N$ (Output at time N+2)

$z_{N+5} = x_{N+3} + x_{N+2} + x_{N+1} + x_N$ (Output at time N+3) \qquad (7)

It follows that:

$$y_N = z_{N+2} \qquad (8)$$

Thus, the circuit 160 of FIG. 5B is equivalent to the circuit 150 of FIG. 5A, except that it accepts 2 inputs and produces 2 outputs per clock cycle and the outputs have an additional delay of 2 samples.

In one embodiment of the present invention, the CIC Decimator integrator circuit 160 of FIG. 5B is cascaded in the same way (shown in FIG. 3 as cascaded integrator circuits 80–88) as the conventional circuit 150 can be cascaded, as was discussed above (block 132 of FIG. 4B).

In one embodiment of the present invention, the CIC Decimator integrator circuit 160 of FIG. 5B includes an integer K-stage integrator further including an integer K of parallel CIC integrators. The K-stage integrator is configured to increase by a K-factor a processing speed of the incoming digital input signal having the pre-assigned data rate, because the parallel K-channel implementation can process simultaneously K number of input words.

Figure 6A:
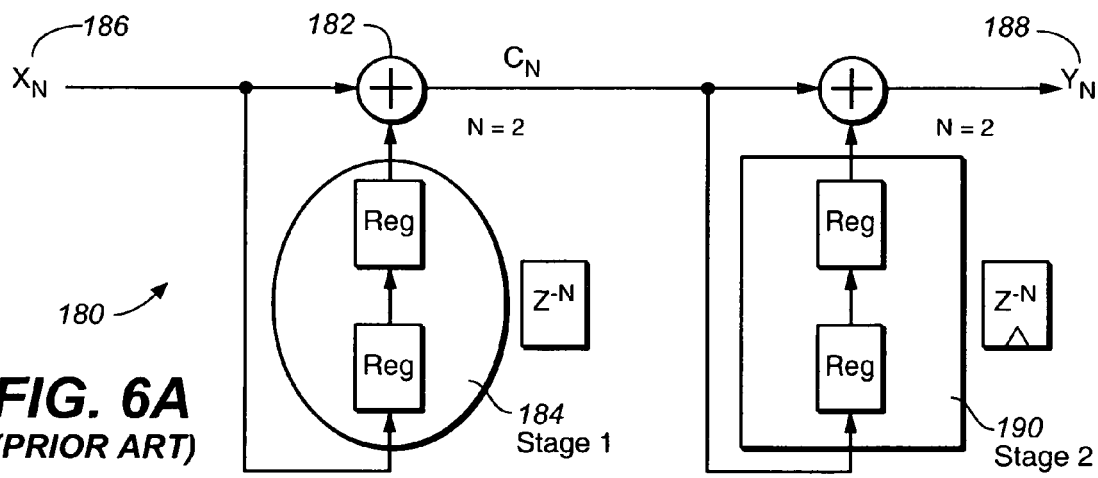
FIG. 6A depicts a conventional CIC comb filter section including at least two sections, each section including a substracter and two registers.
Figure 6B:
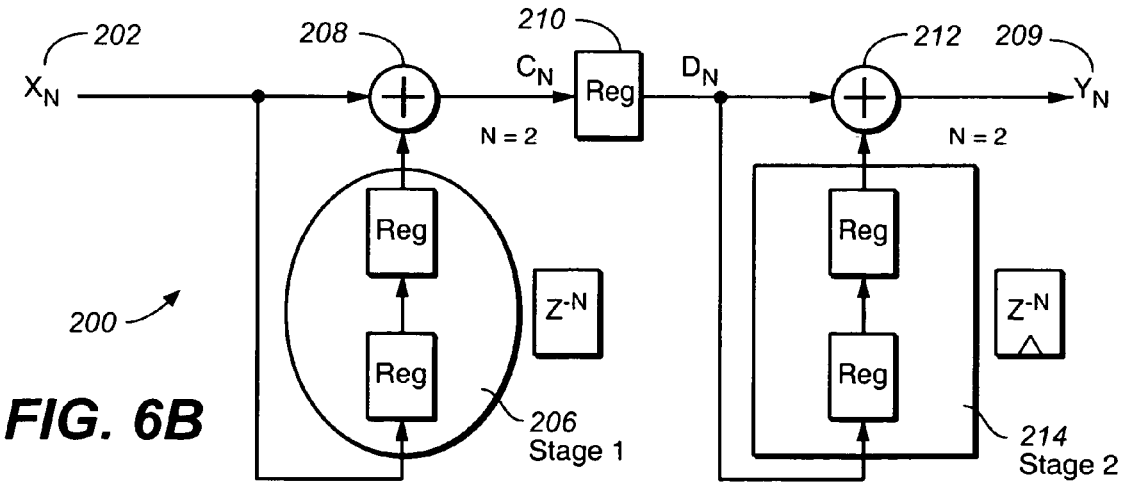
FIG. 6B illustrates a pipelined CIC comb filter section of the present invention with latency.

FIG. 6A depicts a conventional CIC comb filter section 180 including at least two sections, each of sections including a substracter 182 and two registers 184. On the other hand, FIG. 6B illustrates a pipelined CIC comb filter section 200 of the present invention with latency. The extra (pipeline) register 210 is inserted between two sections to enable the pipeline computation of the incoming symbols, so that the CIC Decimator filter 24 (of FIG. 1) can operate at higher speed as compared with the conventional implementation. Indeed, by using a plurality of pipeline registers, each pipeline register placed between at least two comb filter sections, the pipelined CIC comb filter 200 of the present invention can operate by one clock earlier than the conventional CIC comb filter 180, as shown below.

Indeed, in the conventional circuitry 180 of FIG. 6A, the output $y_N$ 188 is derived as follows:

$c_N=x_N-x_{N-2}$ (Output of stage 1)

$y_N=c_N c_{N-2}$ (Output of stage 2)     (9)

Substituting for $c_N$ and $c_{N-2}$ $y_N=(x_N-x_{N-2})-(x_{N-2}-x_{N-4})=x_N-2x_{N-2}+x_{N-4}$     (10)

On the other hand, the output $y_N$ 204 of the pipelined CIC comb filter section 200 of the present invention with latency of FIG. 6B is derived as follows:

$c_N=x_N-x_{N-2}$ (Output of stage 1)

$d_N=c_{N-1}$ (Output of pipeline register)

$y_N=d_N-d_{N-2}$ (Output of stage 2)     (11)

Substituting for $d_N$ $y_N=c_{N-1}-c_{N-3}$     (12)

Substituting for $c_{N-1}$ and $c_{N-3}$ $y_N=(x_{N-1}-x_{N-3})-(x_{N-3}-x_{N-5})=(x_{N-1}-2x_{N-3}+x_{N-5})$     (13)

It follows:

$y_{N+1}=x_N-2x_{N-2}+x_{N-4}$     (14)

Therefore, the circuit 200 of FIG. 6B is equivalent to the circuit 180 of FIG. 6A except the output is delayed by one sample time.

Referring still to FIG. 4A, the conventional CIC Decimator filter includes the integrator block 122, the comb filter block 124, and the decimation block R 114 in between.

Similarly, in one embodiment of the present invention, depicted in FIG. 3, the CIC Decimator filer 24 includes at least one Comb filter part further including M-cascaded comb having an integer M=5 sections (90–98), includes an integrator part further including K-stage integrator having K=5 sections (80–88); and a decimation block R represented by the CIC Gain block 100. Each section of the M-section cascaded comb filter having the integer N of registers (not shown) differentiates the decimated integrated output of the K-stage integrator 89 with a combinatorial delay of N samples. The decimation block R decimates an output signal of the M-stage comb filter 99 by the decimation factor R. Preferably, the number M of cascades in the M-cascaded comb filter is equal to the number K of parallel integrator sections.

In one embodiment, the circuitry that implements the CIC Decimator 24 (of FIG. 3) has to store at least $\log_2[(RN)]^M$ additional bits (which is equal to the gain growth) as compared with the number of bits in the input digital data signal to avoid overflow; wherein R is an integer. Thus, the price that one pays for the present design of the CIC decimator filter is the increased amount of bits that has to be stored in the accumulator register (not shown).

EXAMPLE I

The number of bits in the comb filter section and in the integrator section (accumulator and register) has to be larger than the bit size of the input signal by the number of bits due to the gain growth factor equal to $\log_2[(RN)]^M$. For R=2, N=2, M=8, we have the gain growth factor equal to $\log_2[(4)]^8=16$ bits. So, starting with the input signal including 12 bits, one has to store at least 28 bits in the accumulator register of the CIC Decimator filter of the present invention. As it is well known to those skilled in the art, this can be easily achieved.

Referring still to FIG. 1, in the passband mode of the present invention selected by using the mode_select signal 19, preferably, the A/D sample rate in the chip should be ultimately equal to ½ A/D rate, so that the minimum decimation rate $R_{min}$ is equal to 2.

EXAMPLE II

The chip clock rate limits the maximum baud rate that can be processed. For chip clock rate equal to 100 MHz, the maximum baud rate is equal to ½ chip clock=50 MHz, because the chip needs to have at least 2 samples per symbol the way the demodulator of the present invention is set up. The number of parallel sections K in the CIC K-stage integrator is equal to A/D rate divided by the chip clock rate. For A/D sample rate 800 MHz, and K=8, the chip can process 8 samples per chip clock. As the incoming signal spectrum is sampled faster, less complicated analog designs are required. The downside to the present circuit implementation is that the complexity of the circuit is transferred to the digital part of the circuit. However, the gain imbalances, quadrature imbalances, and DC offsets present in analog baseband circuits are on the order of (−30) dB in the best case scenario, whereas the compensation techniques employed in digital demodulators can reduce theses errors to a level of (−60) dB or better in hard-wired or software implementations. Therefore, the complexity of the digital part of the circuit is beneficial to the circuit performance, whereas the complexity of the analog part of the circuit is detrimental to the circuit performance.

As was discussed above, the CIC Decimator 24 of FIG. 3 includes a plurality of pipeline registers. As depicted in FIG. 6B, each pipeline register 210 is located between at least two consecutive sections of the M-section cascaded comb filter. Each pipeline register is configured to perform a pipeline computation on a plurality of input symbols in order to increase the speed of operation of each section of the M-section cascaded comb filter by N-factor by minimizing the combinatorial delay of N samples. The pipeline delay of the CIC Decimator having the plurality of pipeline registers is determined by a single section of the M-section cascaded comb having an integer N registers.

Figure 7A:
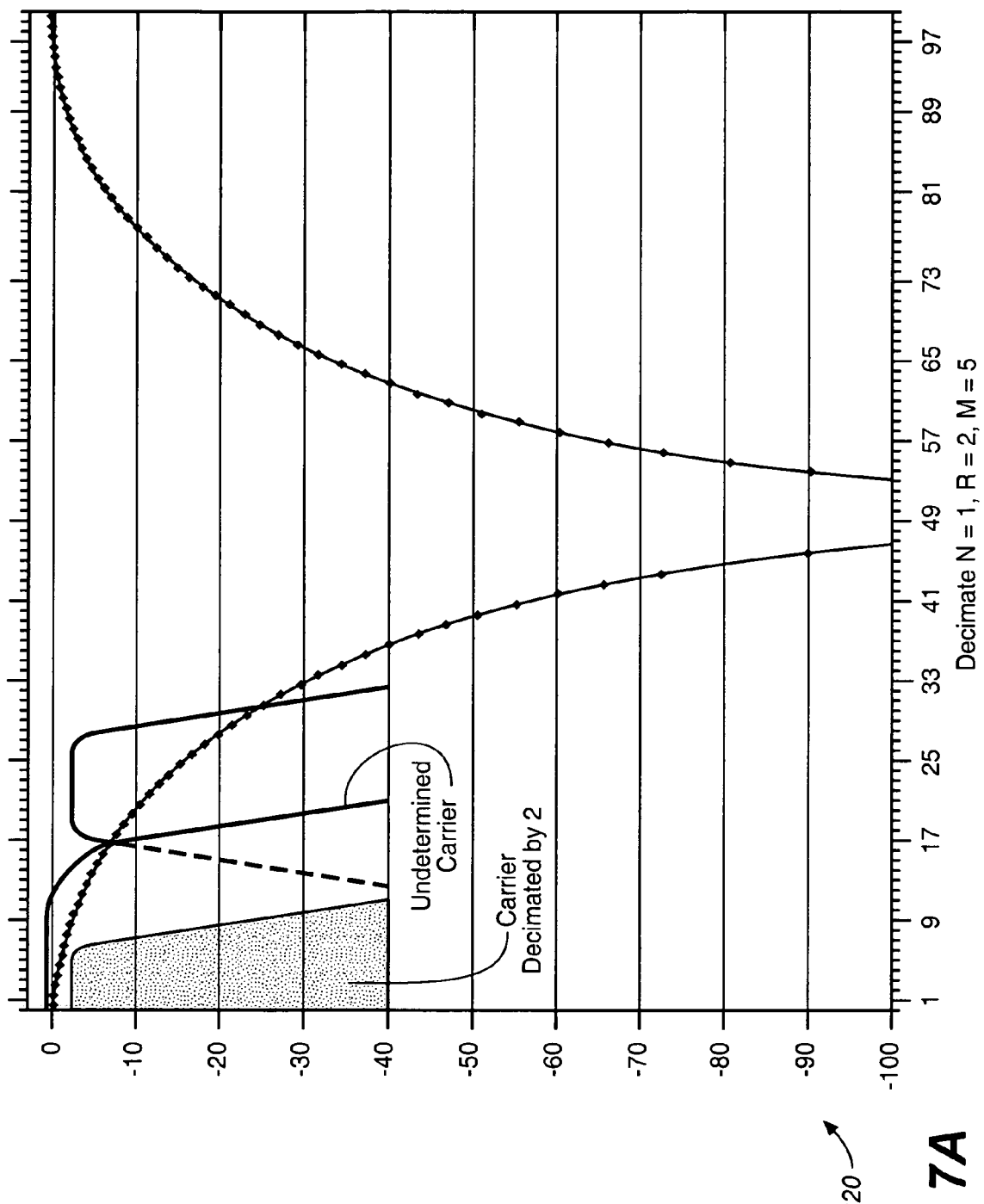
FIG. 7A shows the frequency response function of the pipelined CIC Decimator of the present invention for N=1; R=2, and K=M=5.
Figure 7B:
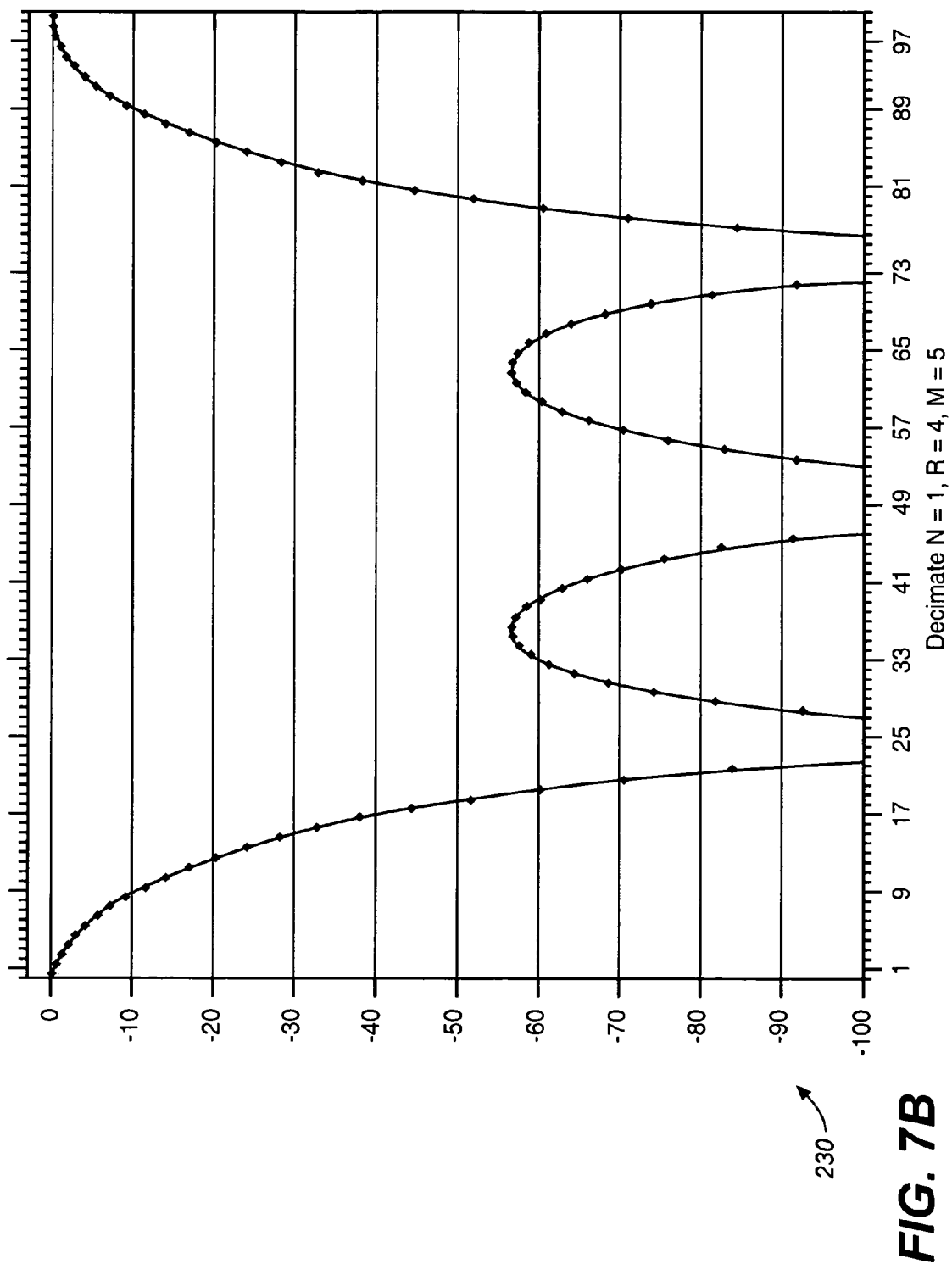
FIG. 7B depicts the frequency response function of the pipelined CIC Decimator of the present invention for N=1; R=4; K=M=5.

In one embodiment of the present invention, FIG. 7A illustrates the frequency response function 220 of pipelined CIC Decimator 24 (of FIG. 1) of the present invention for N=1; R=2, and K=M=5, whereas FIG. 7B is the frequency response function 220 of pipelined CIC Decimator 24 (of FIG. 1) of the present invention for N=1; R=4, and K=M=5.

Referring still to FIG. 1, in one embodiment of the present invention FIG. 8A1 illustrates the spectrum 240 of the sampled input signal 15 including the desired pre-assigned signal 244 and two adjacent signals 242 and 244. FIG. 8A2 shows the spectrum of the sampled pre-assigned signal being processed by the apparatus of the present invention of FIG. 1 after the complex down conversion by $F_s/8$ is performed by the Complex Mixer 22. See discussion above. The spectrum 150 of the down-converted desired pre-assigned signal is centered around Zero frequency, whereas the spectrum of the only remaining adjacent signal 252 is shifted around the $F_s/8$, wherein $F_s$ is the sampling frequency.

In one embodiment of the present invention, FIG. 8A3 depicts the CIC Decimate by 4 Filter 22 (of FIG. 1) frequency response function 260 (N=2) that is similar to the CIC Decimate filter frequency response function 230 of FIG. 7B for R=4, N=1, and M=K=5. The frequency response function 260 carves out a piece 262 of the spectrum of the desired pre-assigned signal 264, and carves out major part of the adjacent signal 266.

In one embodiment of the present invention, FIG. 8B1 illustrates the spectrum of the desired pre-assigned signal 270 after the CIC Filtering (blocks 90–98 of FIG. 3) and prior to Decimate_by_4 operation (block 100 of FIG. 3). The amplitude of the adjacent signal 272 is reduced as compared with the amplitude of the adjacent signal 266 (of FIG. 8A3). FIG. 8B2 shows the spectrum of the desired pre-assigned signal 280 after the CIC Filtering (blocks 90–98 of FIG. 3) and after the Decimate by 4 operation performed by the block 100 of FIG. 3. The spectrum of the desired pre-assigned signal has a round shape 281 that is restored by the shaper filter 26 (of FIG. 1). The spectral gap between the desired pre-assigned signal 280 and the adjacent signal 282 is closed.

In one embodiment of the present invention, FIG. 8B3 depicts the flat spectrum of the desired pre-assigned signal 290 after the Shaper filter 26 (of FIG. 1) restores the original spectrum of the desired pre-assigned signal that was affected by the CIC decimator filter and includes the concave down curvature, as was discussed above.

In one embodiment of the present invention, the Shaper filter 26 (of FIG. 1) is designed to have its frequency response function with concave up curvature that is capable of restoration of the flat spectrum of the original pre-assigned signal spectrum that had the concave down curvature after the CIC Decimator (281 of FIG. 8B2). The spectrum 294 of the adjacent signal is also affected by the shaper filter.

The Shaper filter, as any other digital filter, can be implemented by using a finite impulse response (FIR) filters or infinite impulse response (IIR) filters. The complete discussion of the properties of FIR and IIR filters is given in the book "C Language Algorithms for Digital Signal Processing" by Paul M. Embree and Bruce Kimble, published by Prentice-Hall, Inc. in 1991 and incorporated herein by reference.

The digital filters are the special class of operators viewed in the frequency domain that might allow certain frequency components of the input signals to pass unchanged to the output while blocking other components. There are two broad classes of digital filters. According to the difference equation for a general operator, the common name for filters of the first type is finite impulse response (FIR) filters since their response to an impulse dies away in a finite number of samples. The second class of digital filters are infinite impulse response (IIR) filters. This class includes both autoregressive (AR) filters and the most general ARMA filters. In either type of IIR filter, a single-impulse response at the input can continue to provide output of infinite duration with a given set of coefficients. Stability can be a problem for IIR filter since with poorly chosen coefficients the output can grow without bound for some inputs.

The FIR filter is a preferred embodiment because it has no feedback and therefore unconditionally stable. Given the FIR equation for a filter, there are a number of implementation structures that can be used. Each structure, although mathematically equivalent, may produce different results due to numerical inaccuracies in the computer or special purpose hardware used.

Figure 9:
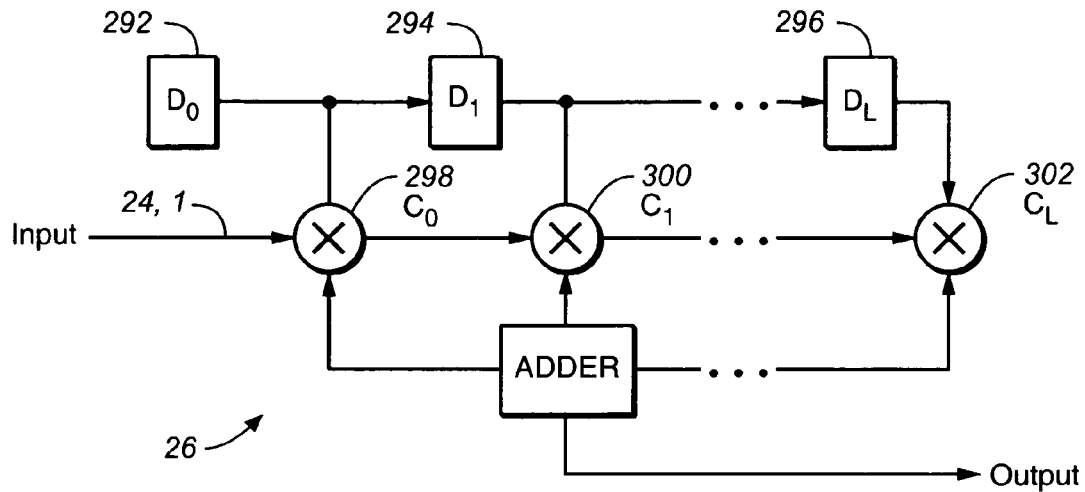
FIG. 9 illustrates the FIR implementation of the Shaper Filter of FIG. 1.

In one embodiment of the present invention, as depicted in FIG. 9, the Shaper filter 26 (of FIG. 1) includes a direct form implementation of the transfer function of the FIR filter including an integer L taps. This structure uses the z-transform equation of the filter transfer function and implements each delay ($D_0$–$D_L$) (292–296) and each coefficient multiplication ($C_0$–$C_L$) (298–302) directly. The Shaper filter 26 has $L_{min}$=32 if the number of registers N in a single section of the M-section cascaded comb filter N=2, and the Shaper filter has $L_{max}$=64 if number of registers N=1.

In one embodiment of the present invention, the CIC Decimator 24 (of FIG. 1) further includes a programmable CIC Decimator having a CIC_Decimator_programmable frequency response function. In one embodiment of the present invention, the variable number of stages K=M is programmed to be in the range of (5–7), the variable decimation factor R is programmed to be in the range of (2–32), and the variable number of registers N in a single section of the M-section cascaded comb filter is programmed to be in the range of (1–2).

The digital Shaper filter can be also implemented by using software design only. In one software embodiment, the Shaper filter 26 (of FIG. 1) further includes a programmable Shaper filter having a Shaper_filter_programmable frequency response function that is equal to an inverse function of the CIC_Decimator_programmable frequency response function within a Bandwidth (BW) of the pre-assigned input digital signal.

Referring still to FIG. 1, in one embodiment of the present invention, the CIC cutoff filter 28 is configured to pass the shaper-signal component having the restored original spectrum of the pre-assigned signal (signal 294 of FIG. 8B3). The CIC cutoff filter 28 (of FIG. 1) is also configured to pass a part of the adjacent signal (294 of FIG. 8B3) having a spectrum part that is carved out by the frequency response function of the CIC cutoff filter 270 illustrated in FIG. 8C1. FIG. BC2 shows the spectrum 180 of the signal after the Cutoff Filter 28 (of FIG. 1).

In one embodiment of the present invention, the Cutoff Filter 28 (of FIG. 1) is implemented by using Low Ripple Cutoff Filter. In one embodiment of the present invention, the Cutoff Filter 28 (of FIG. 1) is implemented by using Parks-McClellan FIR linear phase filter design program that uses the Remez exchange algorithm to design linear phase FIR digital filter with minimum weighted Chebyshev error in approximating the desired ideal frequency response.

Figure 10:
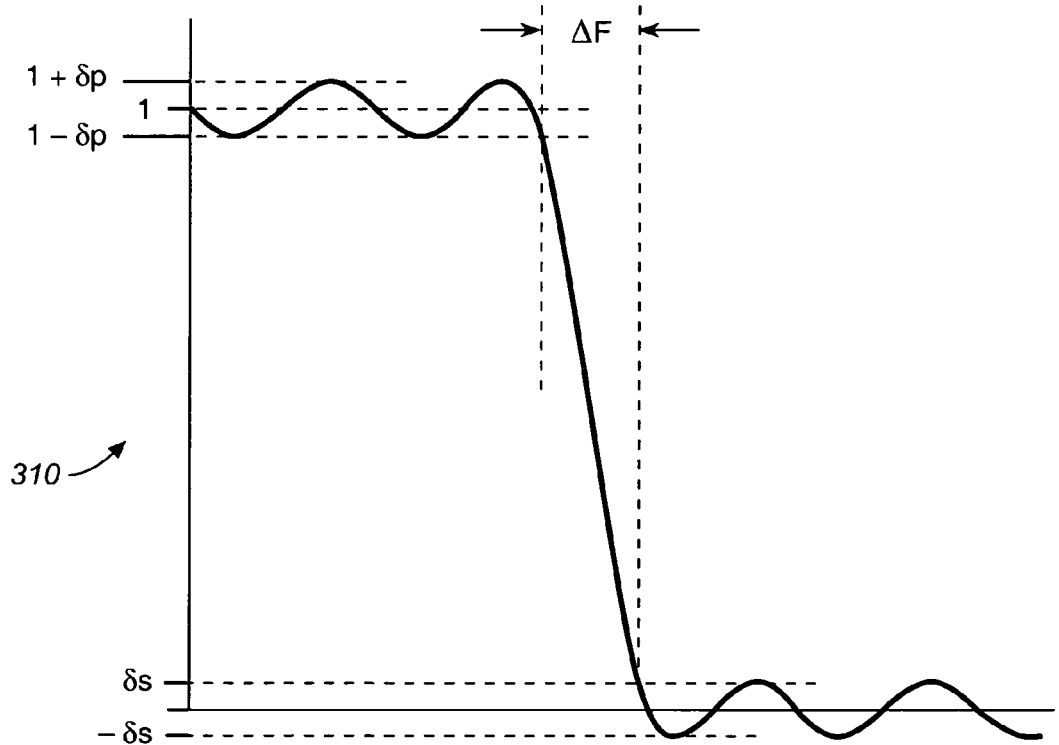
FIG. 10 shows the FIR approximation of the Low Ripple Cutoff Filter of FIG. 1 as an ideal low pass filter including low ripples in the pass band.
Figure 11:
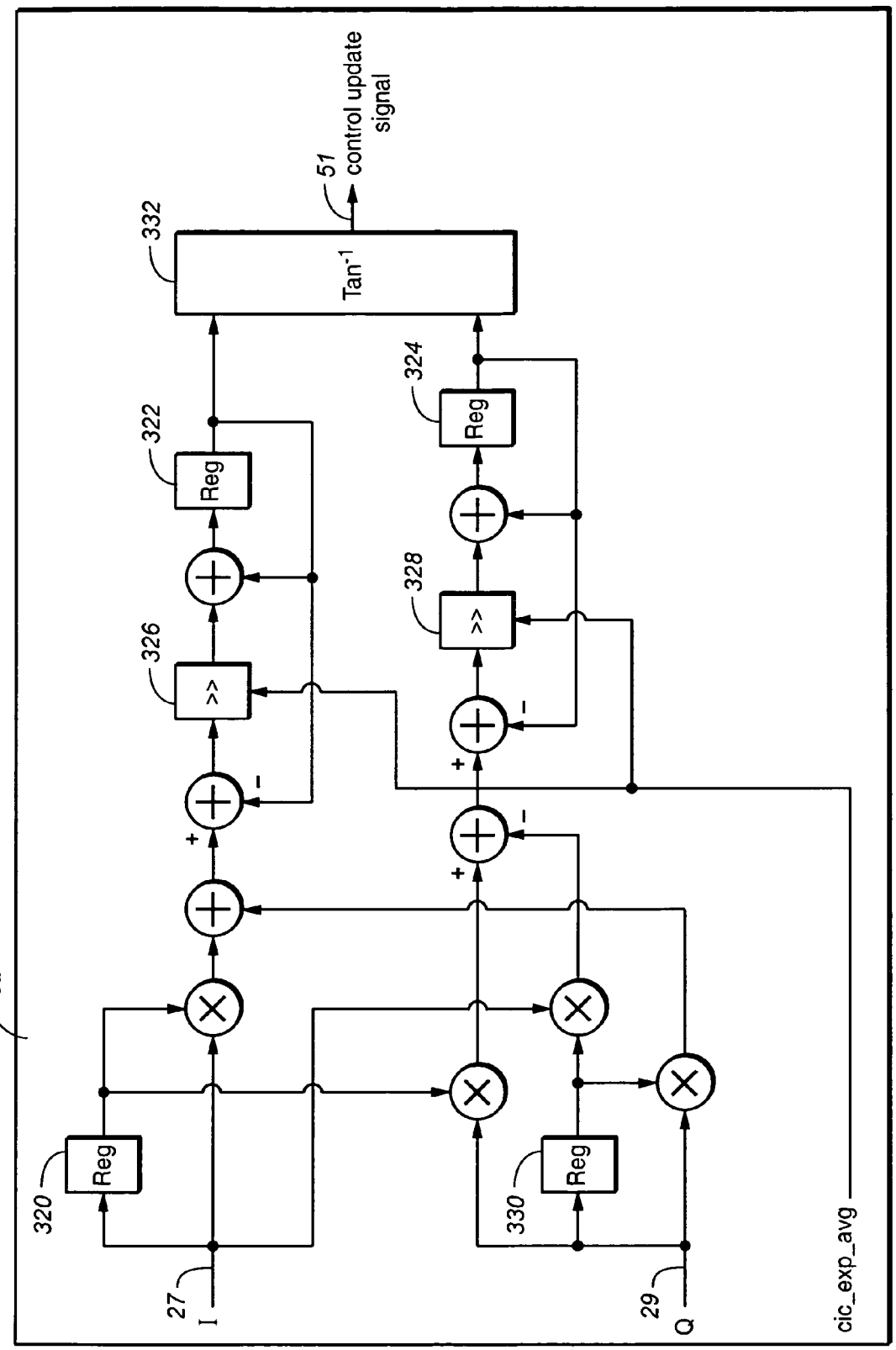
FIG. 11 is a detailed implementation of the Coarse Frequency-estimation block of the present invention.

In one embodiment of the present invention, the FIG. 10 illustrates the FIR approximation 310 for the Low Ripple Cutoff Filter 28 (of FIG. 1) as an ideal low pass filter including low ripples in the pass band that deviates from unity by $\pm\delta_p$, including low ripples in the stop band that deviates from unity by $\pm\delta_s$, and including a transition band of finite nonzero width $\Delta F$ between the pass band and the stop band. Coefficients of the FIR filter (as shown in FIG. 9) should be designed to meet above-identified criteria in order to implement the Low Ripple Cutoff Filter 28 (of FIG. 1). In the software implementation embodiment of the present invention, the coefficients of the FIR implementation of the Low Ripple Cutoff Filter, or Parks-McClellan filter are programmable.

Referring still to FIG. 1, in one embodiment, the apparatus 10 of the present invention further includes the Demodulator 30 configured to demodulate and to extract a frequency component from the shaper_signal component having the restored original spectrum of the pre-assigned signal (280 of FIG. 8C2).

Referring still to FIG. 1, in one embodiment, the apparatus 10 of the present invention further includes the Coarse Frequency estimation block 32 configured to estimate a frequency offset between the pre-assigned carrier frequency and the frequency component extracted by the Demodulator 30 from the shaper_signal component having the restored original spectrum of the pre-assigned signal (280 of FIG. 8C2).

Referring still to FIG. 1, in one embodiment, the apparatus 10 of the present invention further includes the CIC tuner loop filter 34 that is configured to insert the estimated frequency offset into the carrier loop in order to complete the carrier recovery of the pre-assigned input digital signal. The CIC tuner loop filter 34 further includes an adaptive CIC tuner loop. The adaptive CIC tuner loop is configured to perform an adaptive carrier loop frequency adjustment to compensate for a change in an external parameter selected from the group consisting of: {temperature; humidity; and at least one circuit elements aging parameter}.

Figure 12:
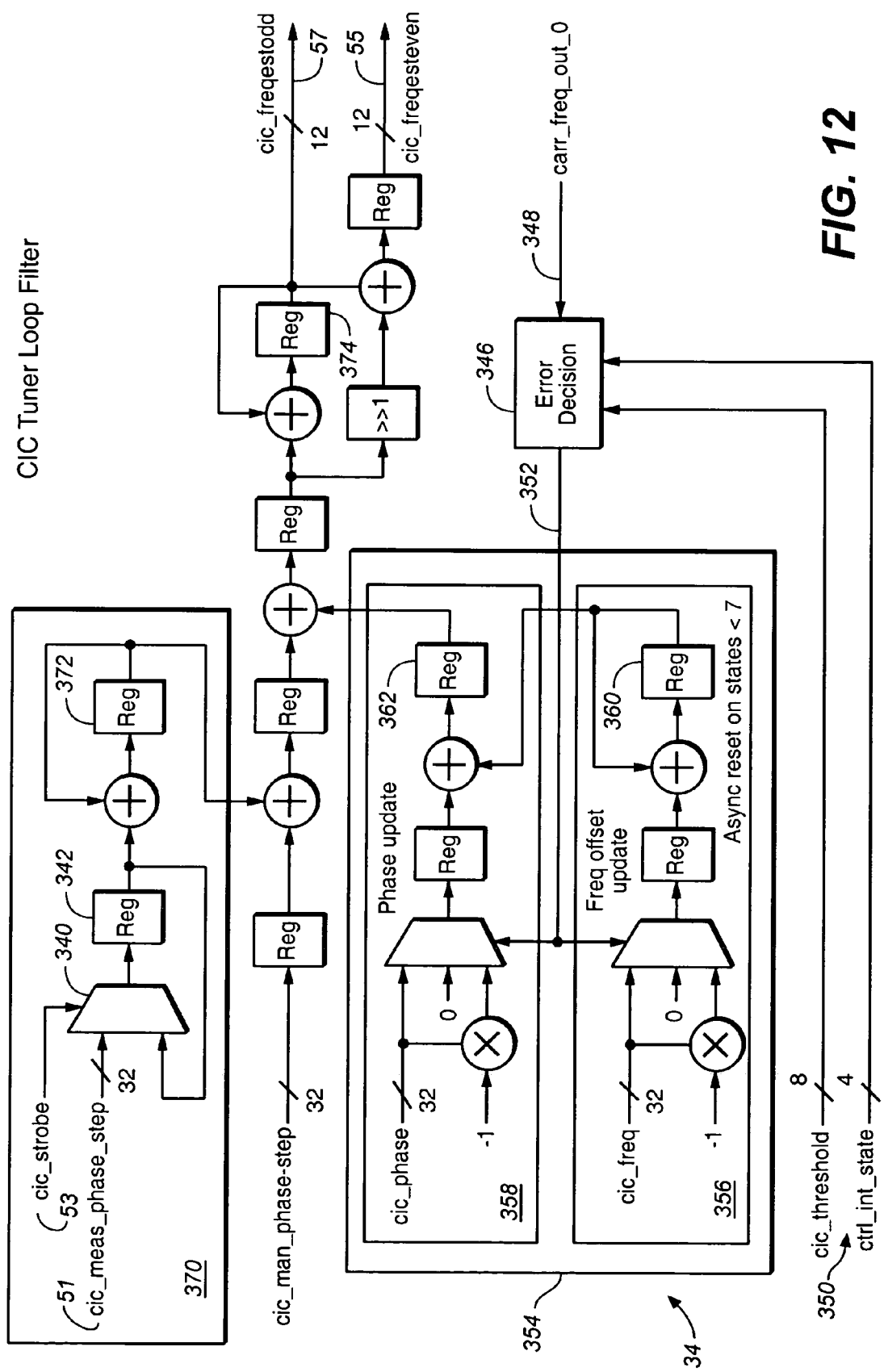
FIG. 12 depicts the CIC tuner loop filter of the present invention in more details.

In one embodiment of the present invention, FIG. 12 depicts the CIC tuner loop filter 34 in more details. The demodulator 30 (of FIG. 1) does a better job of frequency adjustment than the CIC tuner loop filter 34 itself. Therefore, the idea is to push frequency offset determined by the Coarse Frequency estimation block 32 back to zero as a long term solution. The demodulator 30 is most useful when the significant part of the input signal is inside the Nyquist filter. It follows that the demodulator 30 should control the carrier tracking when the Bandwidth (BW) of the tracking loop is a narrow one.

If the snapshot rough frequency offset determined by the Coarse Frequency estimation block 32 is close to zero, the further high tuning frequency adjustment is performed by the carrier loop 36 of the demodulator 30 (of FIG. 1). This is done by the control block 37. In on embodiment, the control block 37 is implemented by using a digital logic.

Referring still to FIG. 12, in one embodiment of the present invention, the CIC tuner loop filter 34 includes the error decision block 346 that can have either a hardwired, or a software implementation. In one embodiment of the present invention, the software implementation of the error decision block 346 further includes an algorithm.

In one embodiment, the algorithm comprises at least the following steps:

if a frequency update in the frequency accumulator exceeds a predetermined high frequency threshold; use a plurality of negative frequency coefficients for a next loop frequency update;

if the frequency update in the frequency accumulator is lower than a predetermined low frequency threshold; use a plurality of positive frequency coefficients for the next loop frequency update;

if a phase update in the phase accumulator exceeds a predetermined high phase threshold; use a plurality of negative phase coefficients for a next loop phase update; and if the phase update in the phase accumulator is lower than a predetermined low phase threshold; use a plurality of positive phase coefficients for the next phase loop update.

In one embodiment, the threshold is programmable depending on how far away the carrier frequency is from the center frequency of the Nyquist filter. Typically, the threshold is within (2–5) % of the frequency offset determined by the Coarse Frequency estimation block 32. The error signal 352 is used by the second order loop filter 354 to slowly adjust the carrier frequency value.

Referring still to FIG. 12, in one embodiment of the present invention, the CIC tuner loop filter 34 includes a coarse frequency offset update block 370 configured to update a coarse frequency offset coefficient in the coarse frequency offset update register 372 using the control update signal 51 generated by the control block 37.

Referring still to FIG. 12, in one embodiment of the present invention, the the CIC tuner loop filter 34 includes the second order loop filter 354 further including a nominal frequency update block 356 configured to update a nominal frequency coefficient stored in the frequency update register 360 using the error signal 352. In one embodiment of the present invention, the second order loop filter 354 further includes a phase update block 358 including an update phase register 362. The phase update block 358 is configured to update the phase coefficient in the update phase register 362 using the error signal 352.

Referring still to FIG. 12, in one embodiment of the present invention, the CIC tuner loop filter 34 includes the second order loop filter 354 further including a nominal frequency update block 356 configured to update a nominal frequency coefficient stored in the frequency update register 370 using the error signal 352.

In one embodiment of the present invention, the CIC tuner loop filter 34 has 3 modes of frequency control, including 'zero' mode corresponding to the carrier loop with wide BW, and '+', and '−' modes corresponding to the carrier loop with narrow BW. In the 'zero' mode, the carrier frequency adjustment is done by carrier loop in the Demodulator because the adjustment has to be done fast. In '+', or '−' modes corresponding to narrow BW, the carrier frequency adjustment is done slowly by the CIC tuner loop filter 34 itself.

Referring still to FIG. 1 (and FIG. 2), in a baseband mode, that is selected by applying the mode_select signal 19, the Complex Mixer 22 is a complex multiplier that down converts a complex signal and outputs only even output signals 22, 1 and 22, 2. Only one NCO block 40 is active at even times. The CIC Decimator block 24 has zero inputs at odd times.

Another aspect of the present invention is directed to the method for demodulating a digital input signal having a pre-assigned symbol rate by using a single sample clock signal. The pre-assigned symbol rate is selected from the group consisting of a plurality of symbol rates.

In one embodiment of the present invention, the method (not shown) comprises the following steps: (A) down converting the input digital signal having the pre-assigned symbol rate from a carrier frequency to a baseband frequency by using a Complex Mixer; (B) performing a filtering-decimation operation by using a Cascaded Integrated Comb (CIC) Decimator filter in order to isolate the down converted digital signal having the pre-assigned symbol rate; (c) generating a CIC_output_signal having a CIC-shaped decimated spectrum by using the (CIC) Decimator filter; (D) restoring an original spectrum of the CIC_output_signal having the CIC-shaped decimated spectrum by using a Shaper filter, wherein an I component and Q component of a shaper_filter_output_signal include a shaper_signal component having the restored original spectrum of the pre-assigned signal and include an adjacent shaper-signal component having a spectrum that is adjacent to the restored original spectrum of the pre-assigned signal; (E) using a CIC cutoff filter to pass the shaper_signal component having the restored original spectrum of the pre-assigned signal and to pass a part of the adjacent signal having a spectrum part that is carved out by a frequency response function of the CIC cutoff filter; (F) demodulating and extracting a frequency component from the shaper_signal component having the restored original spectrum of the pre-assigned signal by using a Demodulator; (G) estimating a frequency offset between the pre-assigned carrier frequency and the real time frequency component of the shaper_signal component having the restored original spectrum of the pre-assigned signal by using a Coarse Frequency estimation block; and (H) completing a carrier recovery of the pre-assigned input digital signal by inserting the estimated by the Coarse Frequency estimation block frequency offset into a carrier loop by using a CIC tuner loop filter.

In one embodiment of the present invention, the step (H) of completing the carrier recovery of the pre-assigned input digital signal further includes the following steps: (H1) generating a control update signal by using a controller; (H2) updating a nominal frequency coefficient in the adaptive CIC tuner loop by using a nominal frequency update block under control of the control update signal; (H3) updating a coarse frequency offset coefficient in the adaptive CIC tuner loop by using a coarse frequency offset update block under control of the control update signal; and (H4) updating a phase coefficient in the adaptive CIC tuner loop by using a phase update block under control of the control update signal.

In one embodiment, the method of the present invention further includes the step of selecting a passband mode or a baseband mode of operation. In the baseband mode of operation, the Complex Mixer is clocked by a clock signal equal to an A/D sampling rate, and outputs Inphase and Quadrature outputs for each clock signal. In the passband mode of operation, the Complex Mixer is clocked by a clock signal equal to one half of said A/D sampling rate, and outputs Inphase and Quadrature outputs for each clock signal.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. Therefore, it is intended that the scope of the invention be defined by the claims appended hereto and their equivalents, rather than by the foregoing description. All changes which come within the meaning and range of equivalency of the claims are to be embraced within their scope.

What is claimed is:

1. An apparatus for demodulating a digital input signal having a pre-assigned symbol rate by using a single sample clock signal; said pre-assigned symbol rate is selected from the group consisting of a plurality of symbol rates; said apparatus comprising:
    a Complex Mixer configured to down convert an input digital signal having said pre-assigned symbol rate signal from a carrier frequency to a baseband frequency;
    a Cascaded Integrated Comb (CIC) Decimator filter electrically communicating with said Complex Mixer, said CIC Decimator configured to perform a filtering-decimation operation to isolate a down converted digital signal having a pre-assigned symbol rate, and configured to output an Inphase (I) component and a Quadrature (Q) component of a CIC_output_signal having a CIC-shaped decimated spectrum;
    a Shaper filter electrically communicating with said (CIC) Decimator filter, said Shaper filter is configured to restore an original spectrum of said I and Q components of said CIC_output_signal having said CIC-shaped decimated spectrum; said Shaper filter configured to output I and Q components of a shaper_filter_output_signal, wherein said I component and said Q component of said shaper_filter_output_signal include a shaper_signal component having a restored original spectrum of said pre-assigned signal and include an adjacent shaper-signal component having a spectrum that is adjacent to said restored original spectrum of said pre-assigned signal;
    a CIC cutoff filter electrically communicating with said Shaper filter; said CIC cutoff filter configured to pass said shaper_signal component having said restored original spectrum of said pre-assigned signal; said CIC cutoff filter configured to pass a part of said adjacent signal having a spectrum part that is carved out by a frequency response function of said CIC cutoff filter;
    a Demodulator electrically communicating with said CIC cutoff filter; said Demodulator configured to demodulate and to extract a frequency component from said shaper_signal component having said restored original spectrum of said pre-assigned signal;
    a Coarse Frequency estimation block electrically communicating with said Demodulator; said Coarse Frequency estimation block configured to estimate a frequency offset between said pre-assigned carrier frequency and said frequency component of said shaper_signal component having said restored original spectrum of said pre-assigned signal;
    and
    a CIC tuner loop filter electrically communicating with said Coarse Frequency estimation block; said CIC tuner loop filter configured to insert said estimated by said Coarse Frequency estimation block frequency offset into a carrier loop in order to complete a carrier recovery of said pre-assigned input digital signal.

2. The apparatus of claim 1, wherein said CIC Decimator further includes:
    a programmable CIC Decimator having a CIC_Decimator_programmable frequency response function.

3. The apparatus of claim 2, wherein said Shaper filter further includes:
    a programmable Shaper filter having a Shaper_filter_programmable frequency response function.

4. The apparatus of claim 3, wherein said Shaper_filter_programmable frequency response function is equal to an inverse function of said CIC_Decimator_programmable frequency response function within a Bandwidth (BW) of said pre-assigned input digital signal.

5. The apparatus of claim 3, wherein said Shaper filter further includes:
    a Finite Impulse Response (FIR) filter including an integer L taps.

6. The apparatus of claim 3, wherein said Shaper filter further includes:
    a Finite Impulse Response (FIR) filter including an integer L of taps and including an integer L of filter coefficients; wherein said FIR filter includes a frequency response function depending on said integer L.

7. The apparatus of claim 1, wherein said CIC Decimator further includes:
   a plurality of CIC integrators; and
   a plurality of Comb filters.

8. The apparatus of claim 1, wherein said CIC Decimator further includes:
   an integer K-stage integrator further including:
      an integer K of parallel CIC integrators;
      an integer K of Numerical Control Oscillators (NCO) s; and
      an integer K of CIC mixers;
   wherein said K-stage integrator is configured to increase by a K-factor a processing speed of said incoming digital input signal having said pre-assigned data rate.

9. The apparatus of claim 8, wherein said CIC Decimator further includes:
   at least one Comb filter further including:
      an integer M-section cascaded comb filter; and wherein each said section of said M-section cascaded comb filter further includes:
         an integer N of registers; and
         a substracter; and
      a decimation block;
   and wherein each said section of said M-section cascaded comb filter having said integer N of registers differentiates said decimated integrated output of said K-stage integrator with a combinatorial delay of N samples;
   and wherein said decimation block decimates an output signal of said M-section cascaded comb filter by a decimation factor R;
   and wherein said CIC Decimator requires $\log_2 [(RN)]^M$ additional bits as compared with a number of bits in said input digital data signal to avoid overflow; wherein R is an integer.

10. The apparatus of claim 9, wherein said integer M of sections in said M-section cascaded comb filter is equal to said integer K of stages in said K-stage integrator.

11. The apparatus of claim 9 further including:
   a plurality of pipeline registers, each said pipeline register being located between at least two consecutive sections of said M-section cascaded comb filter;
   wherein each said pipeline register is configured to perform a pipeline computation on a plurality of input symbols in order to increase the speed of operation of each said section of said M-section cascaded comb filter by N-factor by minimizing said combinatorial delay of N samples;
   and wherein a pipeline delay of said CIC Decimator having said plurality of pipeline registers is determined by one said section of said M-section cascaded comb filter; each said section of said M-section cascaded comb filter having said integer N registers.

12. The apparatus of claim 9 further including:
   an integer M of pipeline registers, each said pipeline register being located within one said section of said M-section cascaded comb filter;
   and wherein each said pipeline register is used as said substracter in one said section of said M-section cascaded comb filter;
   and wherein each said pipeline register is configured to perform a pipeline computation on a plurality of input symbols in order to increase the speed of operation of each said section of said M-section cascaded comb filter by said M-factor;
   and wherein a single section delay caused by said M-section cascaded comb filter is determined by one said section having said integer N registers.

13. The apparatus of claim 8, wherein said CIC Decimator further includes:
   said integer K of parallel CIC integrators; and
   a plurality of pipeline registers; each said pipeline register being used as one said CIC mixer;
   and wherein each said pipeline register is configured to perform a pipeline computation on a plurality of input symbols in order to increase the speed of operation of each said CIC integrator by said K-factor.

14. The apparatus of claim 1, wherein said CIC tuner loop filter further includes:
   an adaptive CIC tuner loop configured to perform an adaptive carrier loop frequency adjustment to compensate for a change in an external parameter selected from the group consisting of: {temperature; humidity; and at least one circuit elements aging parameter}.

15. The apparatus of claim 14, wherein said adaptive CIC tuner loop further includes:
   a controller configured to generate a control update signal;
   a nominal frequency update block electrically communicating with said controller and configured to update a nominal frequency coefficient in said adaptive CIC tuner loop using said control update signal;
   a coarse frequency offset update block electrically communicating with said controller and configured to update a coarse frequency offset coefficient in said adaptive CIC tuner loop using said control update signal; and
   a phase update block electrically communicating with said controller and configured to update a phase coefficient in said adaptive CIC tuner loop using said control update signal.

16. The apparatus of claim 15, wherein said adaptive CIC tuner loop further includes:
   a frequency accumulator, and a phase accumulator;
   and wherein said controller further includes:
      an algorithm comprising at least the following steps:
         if a frequency update in said frequency accumulator exceeds a predetermined high frequency threshold; use a plurality of negative frequency coefficients for a next loop frequency update;
         if said frequency update in said frequency accumulator is lower than a predetermined low frequency threshold; use a plurality of positive frequency coefficients for said next loop frequency update;
         if a phase update in said phase accumulator exceeds a predetermined high phase threshold; use a plurality of negative phase coefficients for a next loop phase update; and
         if said phase update in said phase accumulator is lower than a predetermined low phase threshold; use a plurality of positive phase coefficients for said next phase loop update.

17. A method for demodulating a digital input signal having a pre-assigned symbol rate by using a single sample clock signal; said pre-assigned symbol rate is selected from the group consisting of a plurality of symbol rates; said method comprising the steps of:
   down converting an input digital signal having said pre-assigned symbol rate from a carrier frequency to a baseband frequency by using a Complex Mixer;

performing a filtering-decimation operation by using a Cascaded Integrated Comb (CIC) Decimator filter in order to isolate a down converted digital signal having said pre-assigned symbol rate;

generating a CIC_output_signal having a CIC-shaped decimated spectrum by using said (CIC) Decimator filter;

restoring an original spectrum of said CIC_output_signal having said CIC-shaped decimated spectrum by using a Shaper filter, wherein an I component and Q component of a shaper_filter_output_signal include a shaper_signal component having said restored original spectrum of said pre-assigned signal and include an adjacent shaper-signal component having a spectrum that is adjacent to said restored original spectrum of said pre-assigned signal;

using a CIC cutoff filter to pass said shaper_signal component having a restored original spectrum of said pre-assigned signal and to pass a part of said adjacent signal having a spectrum part that is carved out by a frequency response function of said CIC cutoff filter;

demodulating and extracting a frequency component from said shaper_signal component having said restored original spectrum of said pre-assigned signal by using a Demodulator;

estimating a frequency offset between said pre-assigned carrier frequency and said frequency component of said shaper_signal component having said restored original spectrum of said pre-assigned signal by using a Coarse Frequency estimation block;

and completing a carrier recovery of said pre-assigned input digital signal by inserting said estimated by said Coarse Frequency estimation block frequency offset into a carrier loop by using a CIC tuner loop filter.

18. The method of claim 17 further including the step of:
programming a frequency response function of said CIC Decimator.

19. The method of claim 17 further including the step of:
programming a frequency response function of said Shaper filter, wherein said Shaper_filter_programmable frequency response function is equal to an inverse function of said CIC_Decimator_programmable frequency response function within a Bandwidth (BW) of said pre-assigned input digital signal.

20. The method of claim 17, said CIC Decimator further including at least one Comb filter further including an integer M-section cascaded comb filter and decimation block, each said section of said M-section cascaded comb filter further including an integer N of registers, and a substracter, and wherein said decimation block decimates an output signal of said M-section cascaded comb filter by a decimation factor R; said method further including the step of:

performing a pipeline computation on a plurality of input symbols in order to increase the speed of operation of each said section of said M-section cascaded comb filter by N-factor by minimizing said combinatorial delay of N samples; wherein a pipeline delay of said CIC Decimator having said plurality of pipeline registers is determined by one said section of said M-section cascaded comb filter.

21. The method of claim 17, said CIC tuner loop filter further including an adaptive CIC tuner loop, said method further including the step of:

performing an adaptive carrier loop frequency adjustment to compensate for a change in an external parameter selected from the group consisting of: {temperature; humidity; and at least one circuit elements aging parameter}.

22. The method of claim 21, wherein said step of performing said adaptive carrier loop frequency adjustment further includes the steps of:

generating a control update signal by using a controller;

updating a nominal frequency coefficient in said adaptive CIC tuner loop by using a nominal frequency update block under control of said control update signal;

updating a coarse frequency offset coefficient in said adaptive CIC tuner loop by using a coarse frequency offset update block under control of said control update signal;

and updating a phase coefficient in said adaptive CIC tuner loop by using a phase update block under control of said control update signal.

23. The method of claim 17 further including the step of:
selecting a passband mode or a baseband mode of operation of said Complex Mixer;

wherein said Complex Mixer in said baseband mode is clocked by a clock signal equal to an A/D sampling rate, and outputs Inphase and Quadrature outputs for each said clock signal;

and wherein said Complex Mixer in said passband mode is clocked by a clock signal equal to one half of said A/D sampling rate, and outputs Inphase and Quadrature outputs for each said clock signal.

24. An apparatus for demodulating a digital input signal having a pre-assigned symbol rate by using a single sample clock signal; said pre-assigned symbol rate is selected from the group consisting of a plurality of symbol rates; said apparatus comprising:

a means for down converting an input digital signal having said pre-assigned symbol rate signal from a carrier frequency to a baseband frequency;

a means for performing a filtering-decimation operation to isolate a down converted digital signal having said pre-assigned symbol rate; wherein said means for performing said filtering-decimation operation to isolate said down converted digital signal having said pre-assigned symbol rate further includes:

an integer K of parallel Cascaded Integrated Comb CIC integrators;

an integer K of Numerical Control Oscillators (NCO)s; and an integer K of CIC mixers;

wherein a K-stage integrator is configured to increase by a K-factor a processing speed of said incoming digital input signal having said pre-assigned data rate;

a means for restoring an original spectrum of a pre-assigned signal;

a means for extracting a frequency component from a restored signal having said original spectrum of said pre-assigned signal;

a means for estimating a frequency offset between a pre-assigned carrier frequency and said frequency component of said restored signal having said original spectrum of said pre-assigned signal;

and a means for inserting said estimated frequency offset into a carrier loop in order to complete a carrier recovery of said pre-assigned input digital signal;

25. The apparatus of claim 24 wherein said means for performing said filtering-decimation operation to isolate said down converted digital signal having said pre-assigned symbol rate further includes:
- at least one Comb filter further including:
- an integer M-section cascaded comb filter; and wherein each said section of said M-section cascaded comb filter further includes:
  - an integer N of registers;
  - and
  - a substracter;
- and
- a decimation block;
- and wherein each said section of said M-section cascaded comb filter having said integer N of registers differentiates an integrated output of said K-stage integrator with a combinatorial delay of N samples;
- and wherein said decimation block decimates an output signal of said M-section comb filter by a decimation factor R; and wherein said CIC Decimator requires $\log_2 [(RN)]^M$ additional bits as compared with a number of bits in said input digital data signal to avoid overflow; wherein R is an integer.

26. The apparatus of claim 25 further including:
- a means for performing a pipeline computation on a plurality of input symbols in order to increase the speed of operation of each said section of said M-section cascaded comb filter by N-factor by minimizing said combinatorial delay of N samples.

27. The apparatus of claim 25, wherein said means for performing said adaptive carrier loop frequency adjustment further includes:
- a controller configured to generate a control update signal;
- a nominal frequency update block electrically communicating with said controller and configured to update a nominal frequency coefficient in said adaptive CIC tuner loop using said control update signal;
- a coarse frequency offset update block electrically communicating with said controller and configured to update a coarse frequency offset coefficient in said adaptive CIC tuner loop using said control update signal;
- a phase update block electrically communicating with said controller and configured to update a phase coefficient in said adaptive CIC tuner loop using said control update signal;
- a frequency accumulator;
- and
- a phase accumulator.

28. The apparatus of claim 27, wherein said means for performing said adaptive carrier loop frequency adjustment further includes:
- an algorithm comprising at least the following steps:
  - if a frequency update in said frequency accumulator exceeds a predetermined high frequency threshold; use a plurality of negative frequency coefficients for a next loop frequency update;
  - if said frequency update in said frequency accumulator is lower than a predetermined low frequency threshold; use a plurality of positive frequency coefficients for said next loop frequency update;
  - if a phase update in said phase accumulator exceeds a predetermined high phase threshold; use a plurality of negative phase coefficients for a next loop phase update;
  - and
  - if said phase update in said phase accumulator is lower than a predetermined low phase threshold; use a plurality of positive phase coefficients for said next phase loop update.

* * * * *